(12) United States Patent
Nakata et al.

(10) Patent No.: US 12,532,793 B2
(45) Date of Patent: Jan. 20, 2026

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Yosuke Nakata, Tokyo (JP); Yuji Sato, Tokyo (JP); Taketoshi Shikano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 449 days.

(21) Appl. No.: 18/315,540

(22) Filed: May 11, 2023

(65) Prior Publication Data

US 2024/0047318 A1   Feb. 8, 2024

(30) Foreign Application Priority Data

Aug. 2, 2022   (JP) ................. 2022-123053

(51) Int. Cl.
| | | |
|---|---|---|
| *H01L 23/495* | (2006.01) | |
| *H01L 21/56* | (2006.01) | |
| *H01L 21/66* | (2006.01) | |
| *H01L 23/00* | (2006.01) | |
| *H01L 23/053* | (2006.01) | |
| *H01L 23/31* | (2006.01) | |
| *H01L 25/00* | (2006.01) | |
| *H01L 25/07* | (2006.01) | |

(52) U.S. Cl.
CPC ........ *H01L 23/49575* (2013.01); *H01L 21/56* (2013.01); *H01L 22/14* (2013.01); *H01L 23/053* (2013.01); *H01L 23/3135* (2013.01); *H01L 23/49562* (2013.01); *H01L 24/40* (2013.01); *H01L 25/072* (2013.01); *H01L 25/50* (2013.01); *H01L 24/48* (2013.01); *H01L 24/73* (2013.01); *H01L 2224/40139* (2013.01); *H01L 2224/48175* (2013.01); *H01L 2224/73221* (2013.01)

(58) Field of Classification Search
None
See application file for complete search history.

(56) References Cited

U.S. PATENT DOCUMENTS

| | | | |
|---|---|---|---|
| 2005/0145999 A1* | 7/2005 | Mamitsu | H01L 23/4334 257/667 |
| 2015/0287665 A1* | 10/2015 | Hanada | H01L 25/18 257/691 |
| 2019/0229032 A1* | 7/2019 | Oonishi | H01L 23/49575 |

FOREIGN PATENT DOCUMENTS

WO    2018/047474 A1    3/2018

* cited by examiner

*Primary Examiner* — Sue A Purvis
*Assistant Examiner* — Jordan M Klein
(74) *Attorney, Agent, or Firm* — Studebaker Brackett PLLC

(57) ABSTRACT

An object is to provide a technique capable of reducing stress in the entire semiconductor device. The semiconductor device includes a plurality of sub-modules including a first sealing member, an insulating substrate provided with a first circuit pattern electrically connected to at least one of the conductive plates of the plurality of sub-modules, connection members electrically connected to at least one of the conductive pieces of the plurality of sub-modules, and a second sealing member having lower hardness than the first sealing member, which seals the plurality of sub-modules, the insulating substrate, and the connection members.

22 Claims, 25 Drawing Sheets

F I G. 4
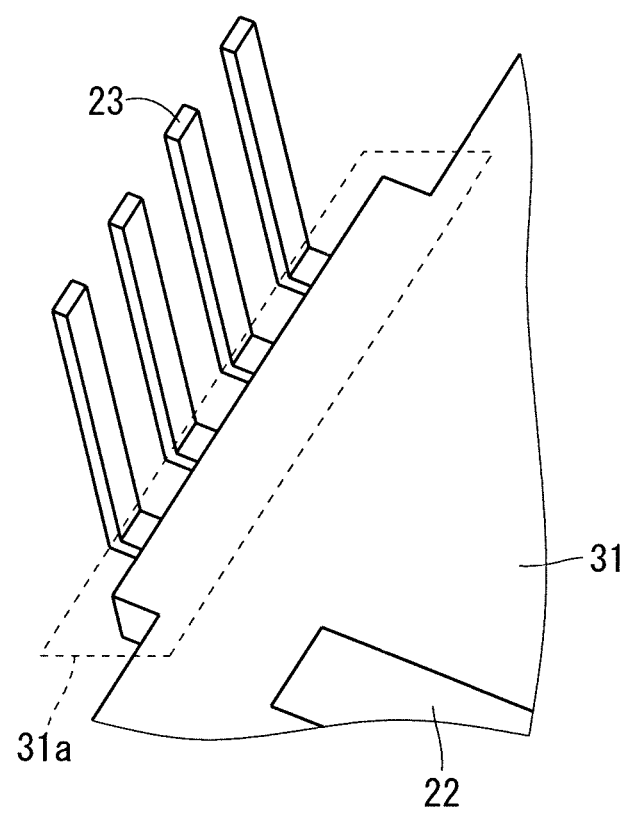

F I G. 7
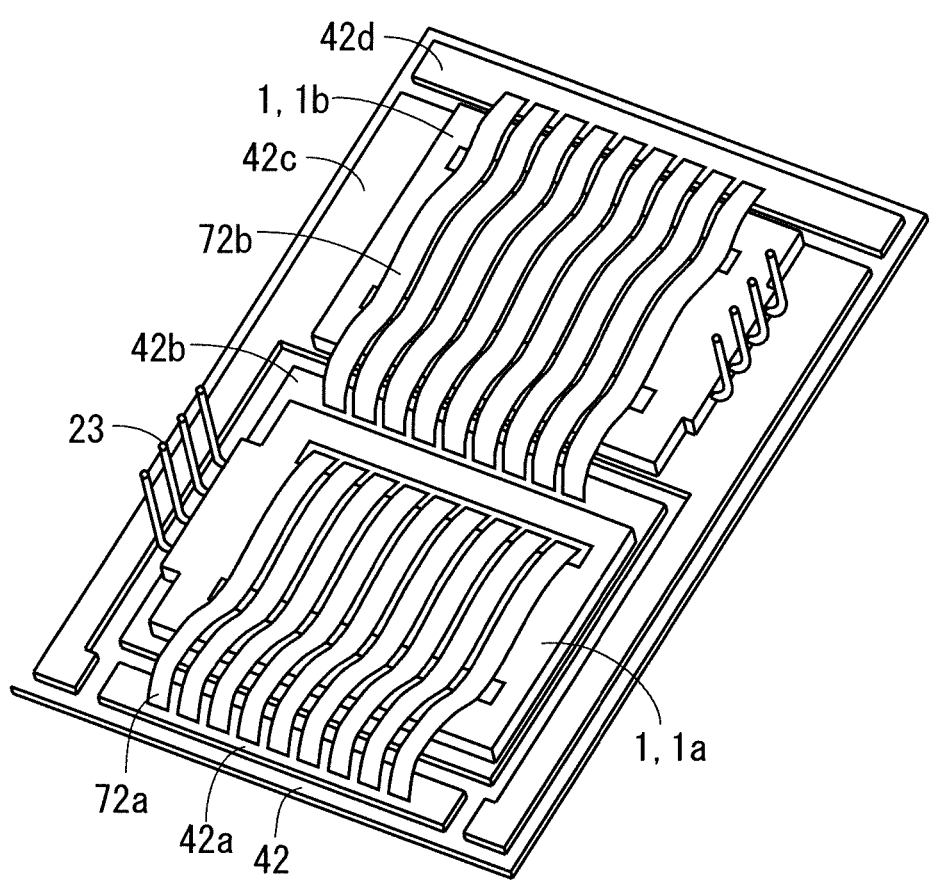

F I G. 9
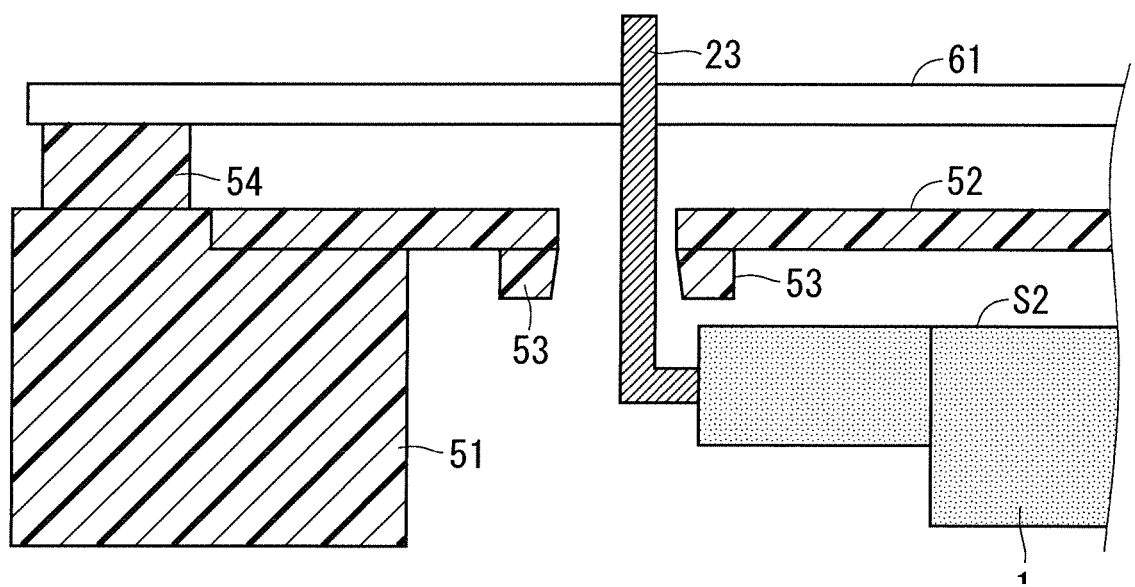

F I G. 1 0
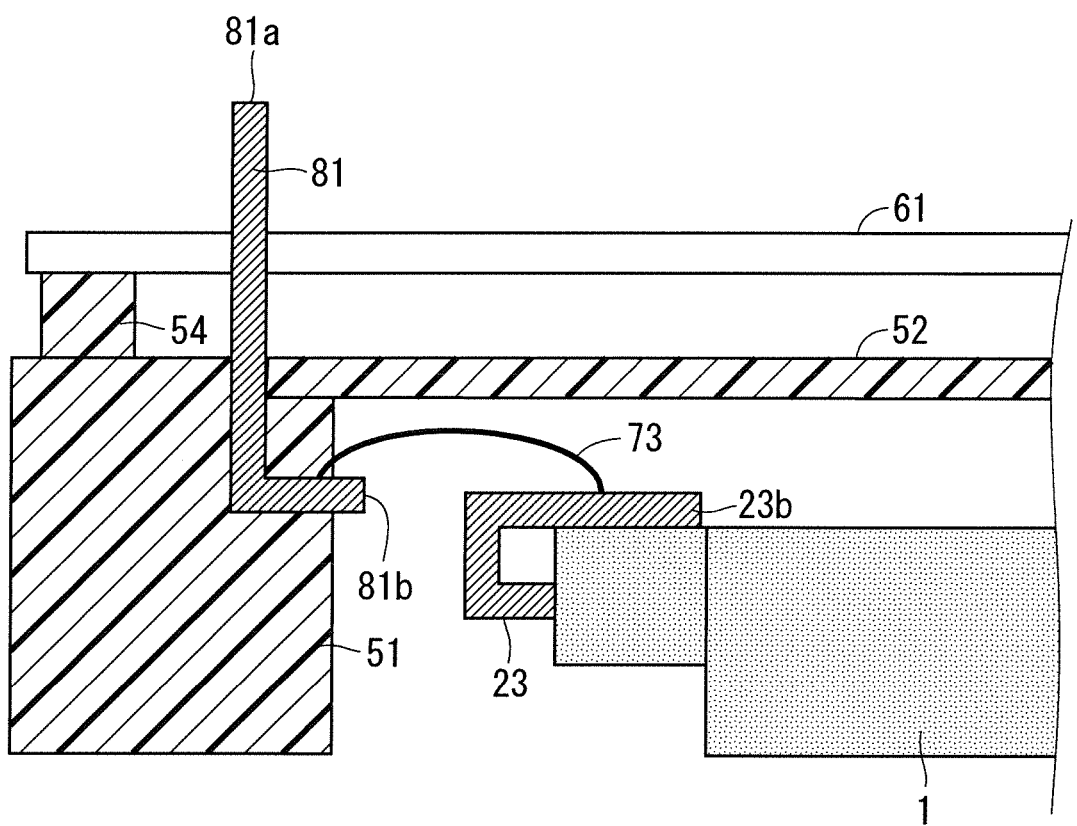

F I G. 1 1
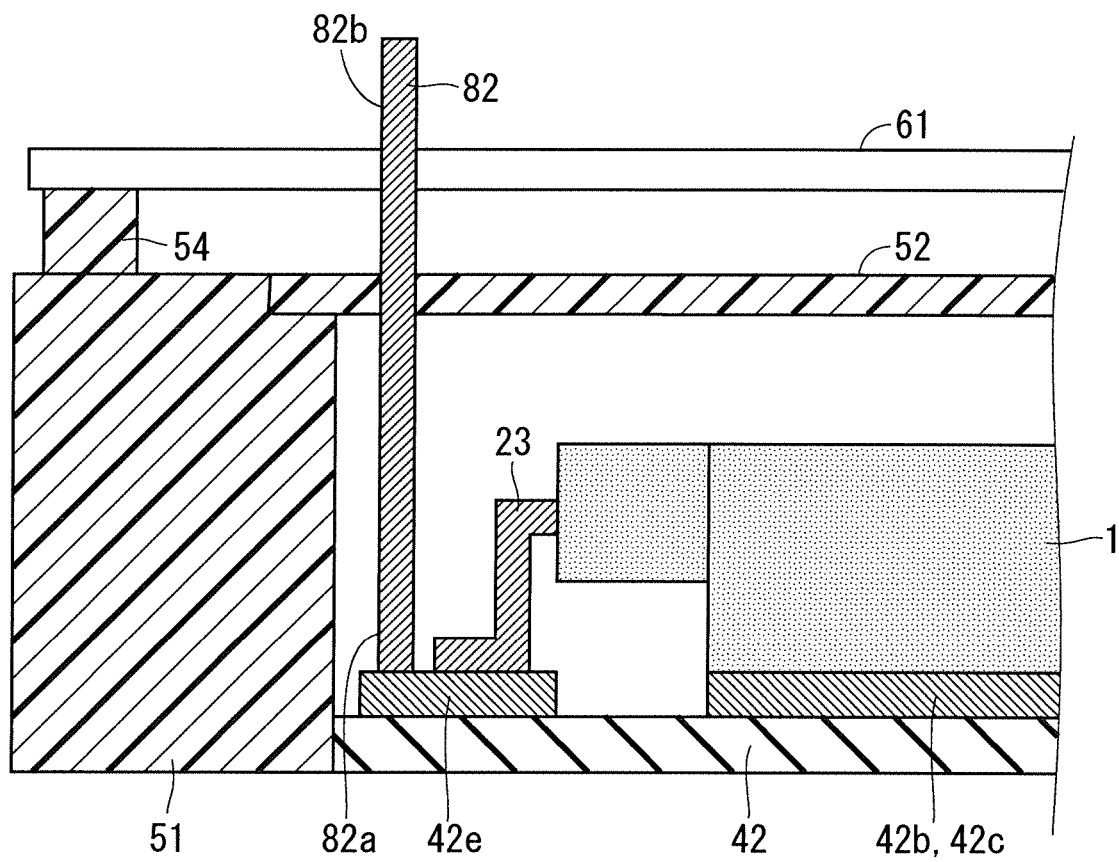

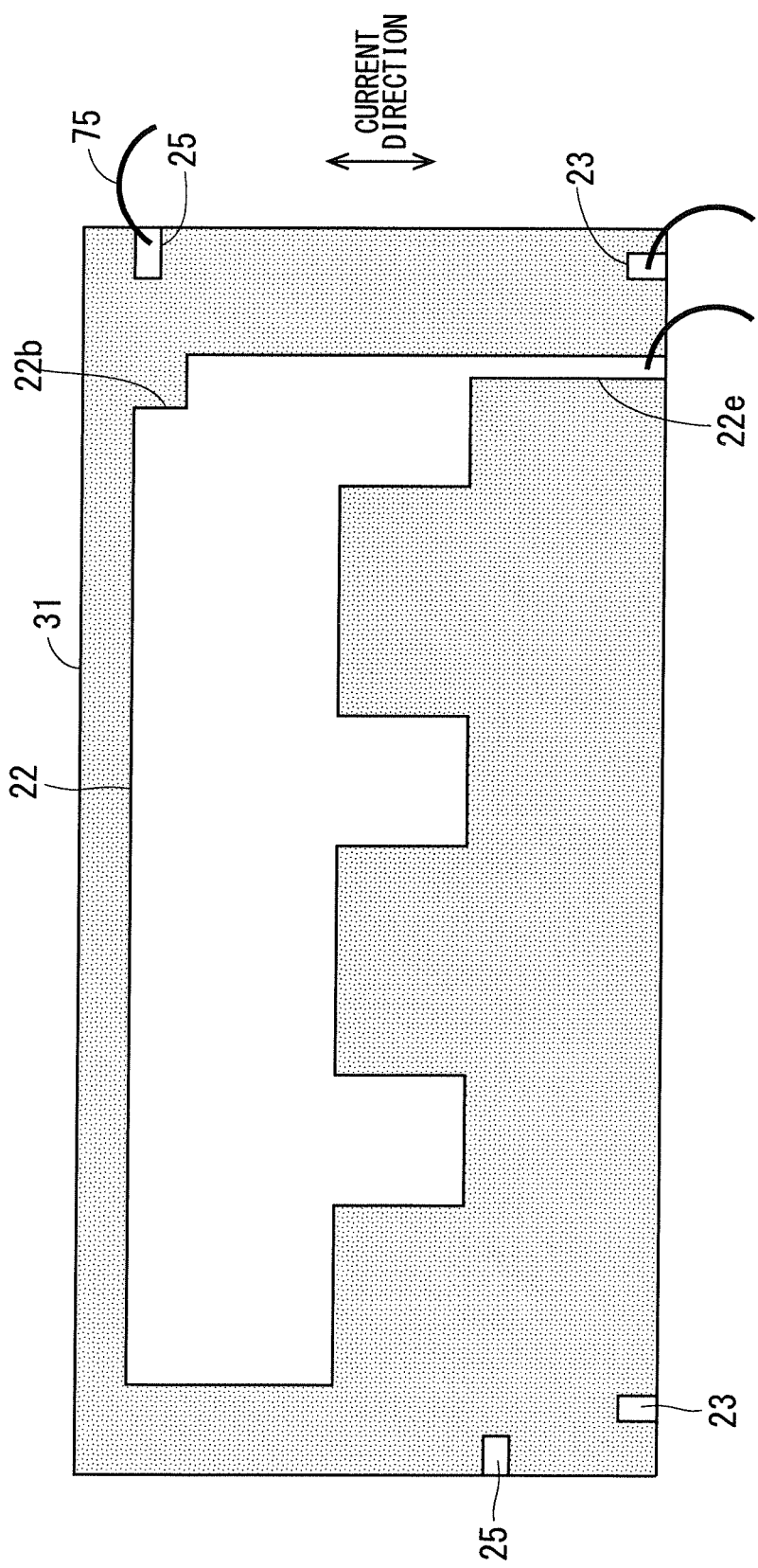

SEMICONDUCTOR DEVICE AND METHOD OF MANUFACTURING SEMICONDUCTOR DEVICE

BACKGROUND OF THE INVENTION

Field of the Invention

The present disclosure relates to a semiconductor device and a method of manufacturing the semiconductor device.

Description of the Background Art

For example, International Publication No. 2018/047474 proposes a semiconductor device including a plurality of sub-modules each containing a plurality of semiconductor elements.

In the technique disclosed in International Publication No. 2018/047474, there has been a problem of increasing stress as thermal stress and warpage accompanying along with the stress, as an increase in the number of sub-modules makes the semiconductor device larger in size.

SUMMARY

The present disclosure has been made in view of the aforementioned problem, and an object thereof is to provide a technique capable of reducing stress in the entire semiconductor device.

A semiconductor device according to the present disclosure includes a plurality of sub-modules having a first main surface, a second main surface on an opposite side of the first main surface, and one or more side surfaces between the first main surface and the second main surface, each of the plurality of sub-modules including a plurality of semiconductor elements including a drain electrode provided on the first main surface side, a source electrode and a control electrode provided on the second main surface side, a conductive plate provided on the first main surface side of the plurality of semiconductor elements and electrically connected to the drain electrodes of the plurality of semiconductor elements, a conductive piece provided on the second main surface side of the plurality of semiconductor elements and electrically connected to the source electrodes of the plurality of semiconductor elements, a first control terminal electrically connected to the control electrodes of the plurality of semiconductor elements, and a first sealing member that seals the plurality of semiconductor elements, the conductive plate, the conductive piece, and the first control terminal with a portion on the first main surface side of the conductive plate, a portion on the second main surface of the conductive piece, and a portion of the first control terminal exposed, an insulating substrate provided with a first circuit pattern electrically connected to at least one of the conductive plates of the plurality of sub-modules, connection members electrically connected to at least one of the conductive pieces of the plurality of sub-modules, and a second sealing member having lower hardness than the first sealing member, which seals the plurality of sub-modules, the insulating substrate, and the connection members.

Stress in the entire semiconductor device can be reduced.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is an enlarged perspective view schematically illustrating the configuration of the sub-module according to the first embodiment;

FIG. 7 is a perspective view schematically illustrating the configuration of the semiconductor device according to the first embodiment;

FIG. 9 is a cross-sectional view schematically illustrating the configuration of the semiconductor device according to the first embodiment;

FIG. 10 is a cross-sectional view schematically illustrating a configuration of a semiconductor device according to a second embodiment;

FIG. 11 is a cross-sectional view schematically illustrating a configuration of a semiconductor device according to a third embodiment;

FIG. 25 is a plan view schematically illustrating the configuration of the sub-module according to the second modification of the sixth embodiment.

DESCRIPTION OF THE PREFERRED EMBODIMENTS

Figure 1:
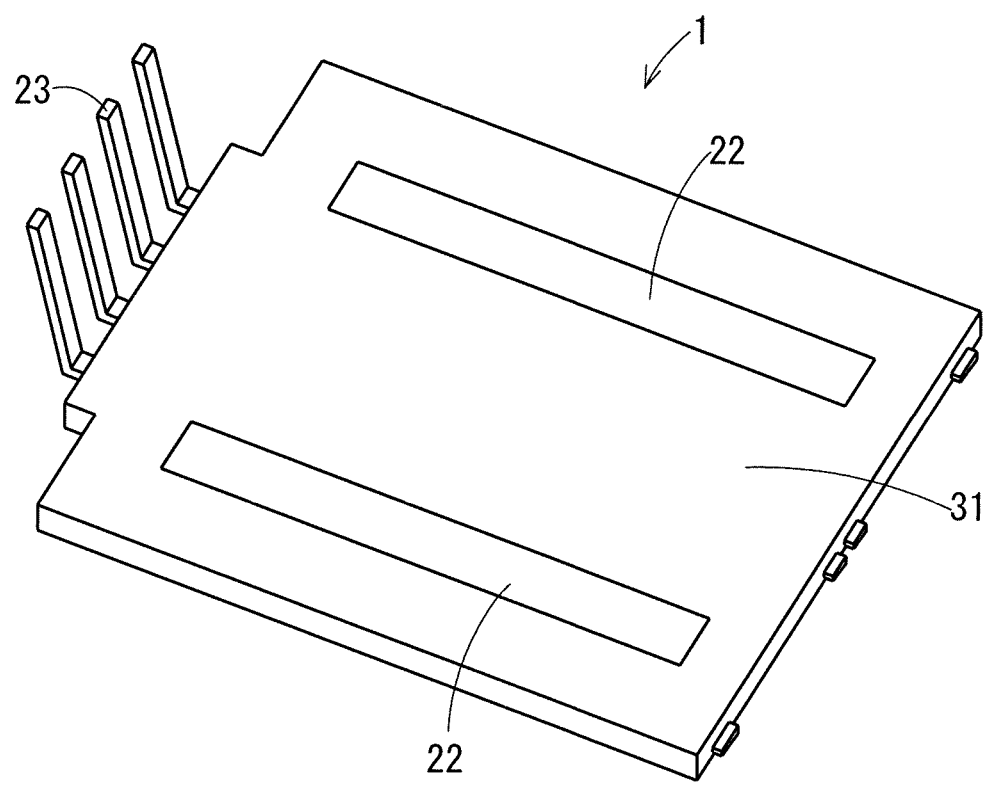
FIG. 1 is a perspective view schematically illustrating a configuration of a sub-module according to a first embodiment.

Hereinafter, embodiments will be described with reference to the attached drawings. Features described in each of the following embodiments are examples; therefore, not all features are necessarily essential. Further, in the description to be made below, similar components are denoted by the same or similar reference numerals across a plurality of embodiments, and descriptions of different components will be mainly made. Also in the description described below, when terms specifying specific positions and directions such as "up", "low", "left", "right", "front", "back" and the like do not necessarily coincide with the positions and directions at the time of implementation.

First Embodiment

A semiconductor device according to the first embodiment includes a plurality of sub-modules. A configuration of the sub-module will be described below.

<Sub-Module>

Figure 2:
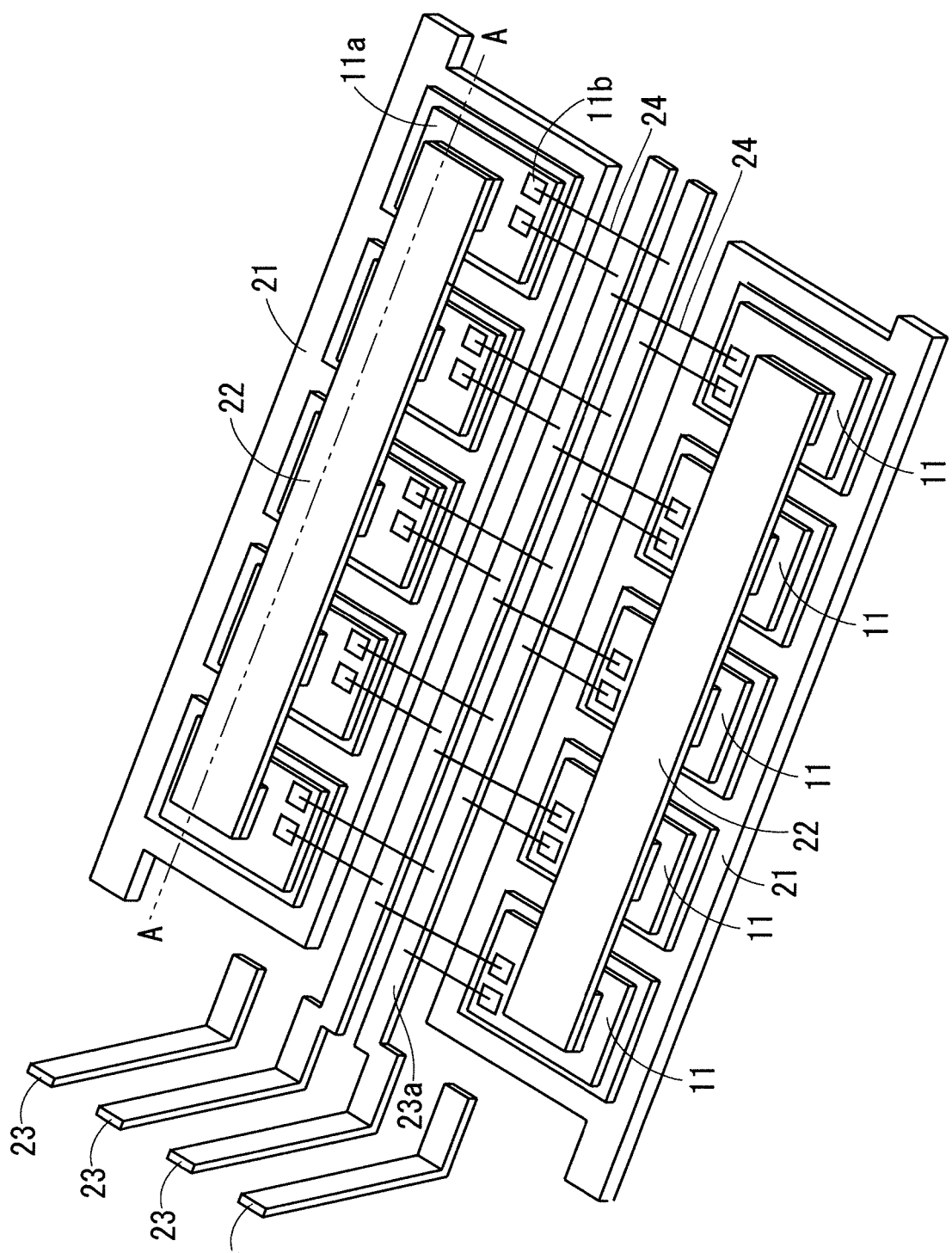
FIG. 2 is a perspective view schematically illustrating the configuration of the sub-module according to the first embodiment.
Figure 3:
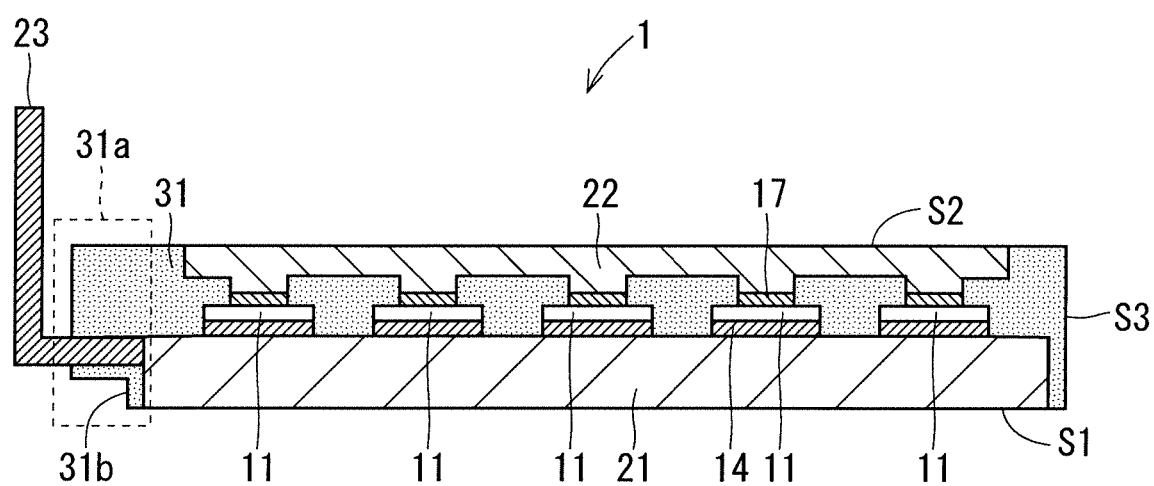
FIG. 3 is a perspective view schematically illustrating the configuration of the sub-module according to the first embodiment.

FIG. 1 is a perspective view schematically illustrating a configuration of a sub-module 1 according to the first embodiment, and FIG. 2 is a perspective view illustrating a configuration where a first sealing member 31 is removed from the configuration of FIG. 1. FIG. 3 is a cross-sectional view illustrating the configuration of the sub-module 1 taken along the line A-A of FIG. 2.

As illustrated in FIG. 3, the sub-module 1 according to the first embodiment has a lower surface S1 as a first main surface, an upper surface S2 as a second main surface opposite to the lower surface S1, and a side surface S3 between the lower surface S1 and the upper surface S2. Although in the description below, the side surface S3 is plural in number, being a single one may also be adoptable.

As illustrated in FIGS. 1 to 3, the sub-module 1 includes a plurality of semiconductor elements 11, conductive connection members 14 and 17, conductive plates 21, conductive pieces 22, first control terminals 23, wires 24, and the first sealing member 31.

The semiconductor elements 11 of FIG. 2 have an unillustrated drain electrode provided on the lower surface S1 side, and a source electrode 11a and a control electrode 11b provided on the upper surface S2 side. Voltage control of the control electrode 11b enables conduction between the drain electrode on the lower surface S1 side and the source electrode 11a on the upper surface S2 side.

The semiconductor element 11 may be, for example, a semiconductor switching element or a combination of a semiconductor switching element and a diode. The semiconductor switching element is, for example, a Metal Oxide Semiconductor Field Effect Transistor (MOSFET), an Insulated Gate Bipolar Transistor (IGBT), a Reverse Conducting-IGBT (RC-IGBT), or the like. The diode is, for example, a Schottky Barrier Diode (SBD), a PN junction diode (PND), or the like.

The material of the semiconductor element 11 may be typical silicon (Si) or a wide band gap semiconductor such as silicon carbide (SiC), gallium nitride (GaN), or diamond. The configuration of the material of the semiconductor element 11 being a wide band gap semiconductor enables the stable operation under high temperature and high voltage and the raising of the switching speed. In the following description, it is assumed that the material of the semiconductor element 11 is SiC.

As illustrated in FIG. 3, the conductive plate 21 having, for example, a flat plate shape, is provided on the lower surface S1 side of the plurality of semiconductor elements 11, and is electrically connected to the drain electrodes of the plurality of semiconductor elements 11. The conductive connection members 14 electrically connect the conductive plate 21 and the drain electrodes of the plurality of semiconductor elements 11.

The conductive piece 22 is provided on the upper surface S2 side of the plurality of semiconductor elements 11 and electrically connected to the source electrodes 11a of the plurality of semiconductor elements 11. The conductive connection members 17 electrically connect the conductive piece 22 and the source electrodes 11a of the plurality of semiconductor elements 11.

As illustrated in FIG. 2, the first control terminals 23 are electrically connected to the control electrodes 11b of the plurality of semiconductor elements 11. Although in the first embodiment, the first control terminals 23 and the control electrodes 11b of the semiconductor elements 11 are connected by wires 24, the connection is not limited thereto.

The first sealing member 31 seals the plurality of semiconductor elements 11, the conductive plates 21, the conductive pieces 22, the first control terminals 23, and the wires 24 with portions on the lower surface S1 side of the conductive plates 21, portions on the upper surface S2 side of the conductive pieces 22, and portions of the first control terminals 23 exposed. The material of the first sealing member 31 includes, for example, a curable resin.

The lower surface, the upper surface, and the side surfaces of the first sealing member 31 correspond to, and are substantially the same as, the lower surface S1, the upper surface S2, and the side surfaces S3 of the sub-module 1, respectively. In the first embodiment, the portions of the first control terminals 23 exposed from the first sealing member 31 exposed from one of the plurality of side surfaces of the first sealing member 31 that respectively correspond to the plurality of side surfaces S3 of the sub-module 1, however, the configuration is not limited thereto. For example, the exposed portions of the first control terminals 23 may be exposed from the plurality of side surfaces of the first sealing member 31, or, as in the fifth embodiment, the exposed portions of the first control terminals 23 may be exposed from the upper surface of the first sealing member 31 corresponding to the upper surface S2 of the sub-module 1.

The material of the conductive plates 21 and the first control terminals 23 may contain copper, for example. Each of the conductive plates 21 and the first control terminals 23 may be, for example, a frame-like member used for simultaneous manufacturing of a plurality of sub-modules 1 integrated with external connection parts. The material of the conductive pieces 22 may include copper or silver, for example.

It is desirable that the melting point of at least one of the conductive connection members 14 or 17 is higher than the processing temperature when assembling a semiconductor device from the plurality of sub-modules 1. According to such a configuration, a connection failure is avoided which is caused by at least one of the conductive connection members 14 or 17 inside the sub-module 1 is melted when assembling a semiconductor device from the plurality of sub-modules 1. The material of the conductive connection members 14 and 17 may contain, for example, silver or copper in order to satisfy the relationship between the above melting point and the process temperature, and the conductive connection members 14 and 17 may be formed, for example, by a sintering process.

It is desirable that the plurality of semiconductor elements 11 and the conductive pieces 22 are electrically connected by a pressureless connection process that does not involve pressure. According to the pressureless connection process, suppression in damaging the plurality of semiconductor elements 11 due to the pressing of the conductive pieces 22 against the plurality of semiconductor elements 11 is ensured. In particular, the pressureless connection process is effective in a configuration where a termination structure that maintains the withstand voltage is provided on the source electrode 11a side of the semiconductor element 11, and a portion in the semiconductor element 11 connected to the conductive piece 22 is smaller than the semiconductor element 11 since the semiconductor element 11 is susceptible to damage. Further, according to the pressureless connection, misalignment of the conductive pieces 22 by the pressuring can also be avoided, so that the yield of the sub-module 1 can be improved.

In the configuration in which the material of the wires 24 illustrated in FIG. 2 contains, for example, aluminum, the member cost of the wire 24 is reduced. In a configuration in which the material of the wire 24 contains at least one of silver or gold, for example, a control pad of the control electrode 11b can be reduced in size, so a reduction in the cost of the semiconductor element 11 can be expected. In this configuration, the diameter of the wire 24 can also be reduced and this enables to make the height of the loop of the wire 24 low, this further enables to suppress the wire 24 from being exposed from the first sealing member 31 even if the thickness of the sub-module 1 or the first sealing member 31 is made small. The reduced thickness of the sub-module 1 not only enables to make the replacement of the semiconductor elements 11 facilitated but also reduces the stress applied to the semiconductor elements 11 by the first sealing member 31.

As illustrated in FIG. 2, the plurality of semiconductor elements 11 may be arranged in a plurality of rows (two rows in FIG. 2), each row extending along the direction in which the conductive plate 21 extends, and the first control terminals 23 may include lead portions 23a provided between the semiconductor elements 11 in adjacent rows. Further, the lead portions 23a may be provided in parallel with the conductive plates 21. According to such a configuration, in terms of the plurality of semiconductor elements 11, reduction in variations in the distance between the first control terminal 23 and the control electrodes 11b is ensured and this enables to synchronize operation timing of the plurality of semiconductor elements 11.

The control pad of the control electrode 11b may include, for example, a current sense pad, a Kelvin emitter pad, a temperature sense diode pad, as well as a gate pad to which a gate drive voltage is applied for controlling On and Off of the semiconductor element 11. The current sense pad, which is a control pad for detecting the current flowing in the cell region of the semiconductor element 11, is a control pad for causing a current that is a fraction to several ten thousandths of the current flowing through the entire cell region to flow through part of the cell region when the current flows through the cell region of the semiconductor element 11. A Kelvin emitter pad is a control pad to which a gate drive voltage is applied to control On and Off of the semiconductor element 11. The temperature sensing diode pad is a control pad electrically connected to the temperature sensing anode and cathode provided on the semiconductor element 11. The temperature of semiconductor element 11 is measured on the basis of the voltage between the anode and the cathode of the temperature sensing diode provided within the cell region.

As described above, in the sub-module 1, from the first sealing member 31, the conductive plates 21 are exposed on the lower surface S1 side, the conductive pieces 22 are exposed on the upper surface S2 side, and the first control terminals 23 are exposed on the side surface S3. According to such a configuration, the creepage distance among the exposed portions of the conductive pieces 22, the exposed portions of the conductive plate 21, and the exposed portions of the first control terminals 23 is expanded and this allows a screening test performed at high voltage and high current.

FIG. 4 is an enlarged perspective view schematically illustrating the part of the side surface S3 of the sub-module 1. As illustrated in FIG. 4, the side surface of the first sealing member 31 corresponding to the side surface S3 of the sub-module 1 may have a protruding portion 31a protruding outward in plan view of the first sealing member 31 and partially covering the first control terminals 23. According to such a configuration, the creepage distance among the first control terminals 23, the conductive plate 21 being the drain potential, and the conductive pieces 22 being the source potential can be expanded at the time of the screening test and installing the product.

Further, as illustrated in FIG. 3, a step portion 31b may be provided in the part that is located in a different direction from the direction the protruding portion 31a protrudes, that is, on the side portion of the protruding portion 31a. In FIG. 3, the side portion of the protruding portion 31a, which is the part of the protruding portion 31a on the lower surface S1 side, may be the part of the protruding portion 31a on the upper surface S2 side. According to such a configuration, the above creepage distance can further be expanded.

<Configuration of Semiconductor Device>

Figure 5:
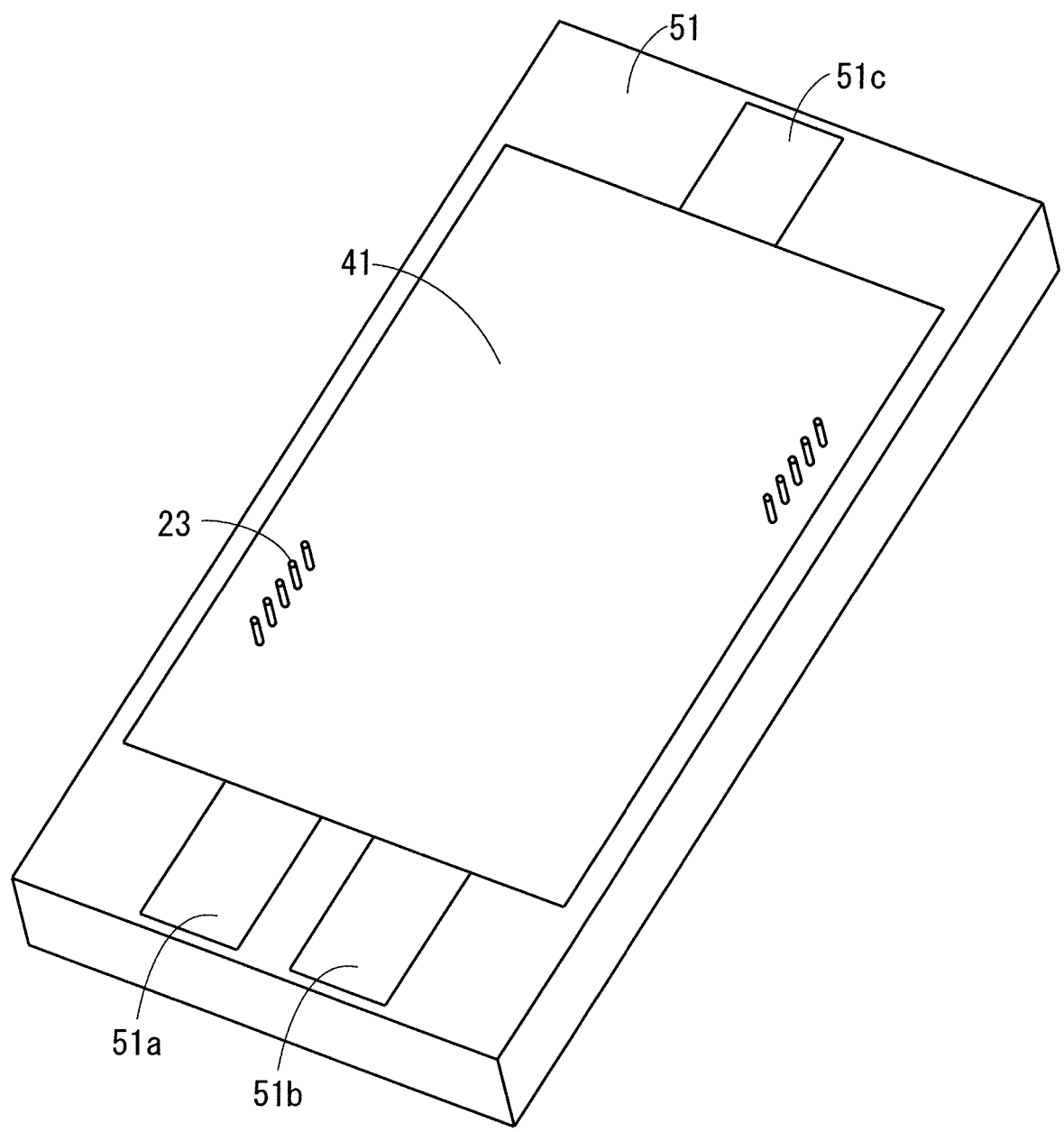
FIG. 5 is a perspective view schematically illustrating the configuration a semiconductor device according to the first embodiment.
Figure 6:
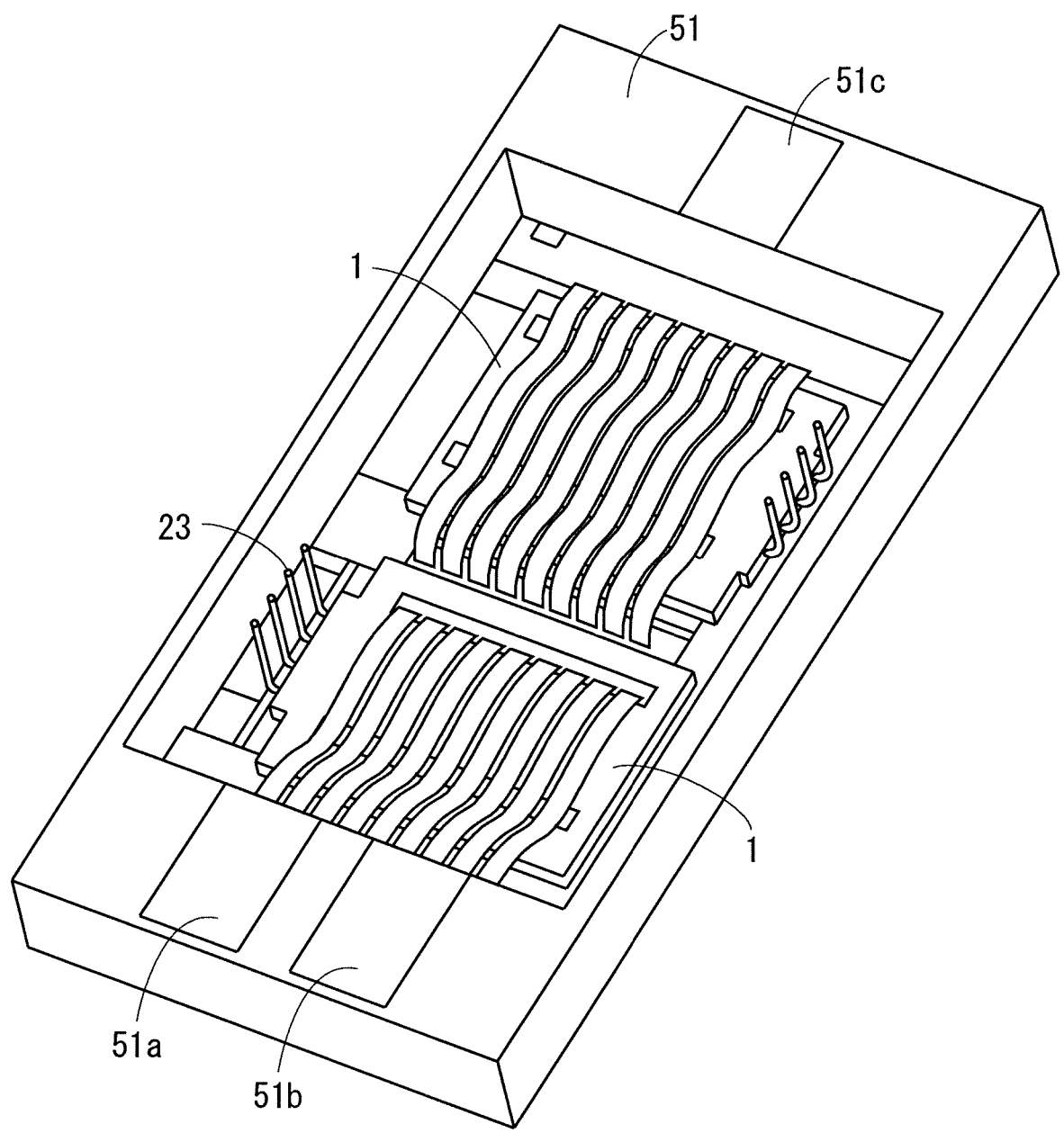
FIG. 6 is a perspective view schematically illustrating the configuration of the semiconductor device according to the first embodiment.

FIG. 5 is a perspective view schematically illustrating a configuration of the semiconductor device according to the first embodiment, and FIG. 6 is a perspective view illustrating a configuration where a second sealing member 41 is removed from the configuration of FIG. 5. FIG. 7 is a perspective view illustrating a configuration where a case 51 is removed from the configuration of FIG. 6, and FIG. 8 is a diagram illustrating a configuration where connection members 72a and 72b are removed from the configuration of FIG. 7.

As illustrated in FIGS. 5 to 8, the semiconductor device according to the first embodiment includes a plurality of sub-modules 1 (sub-modules 1a and 1b), the second sealing member 41, an insulating substrate 42, the case 51 and connection members 72a and 72b.

Figure 8:
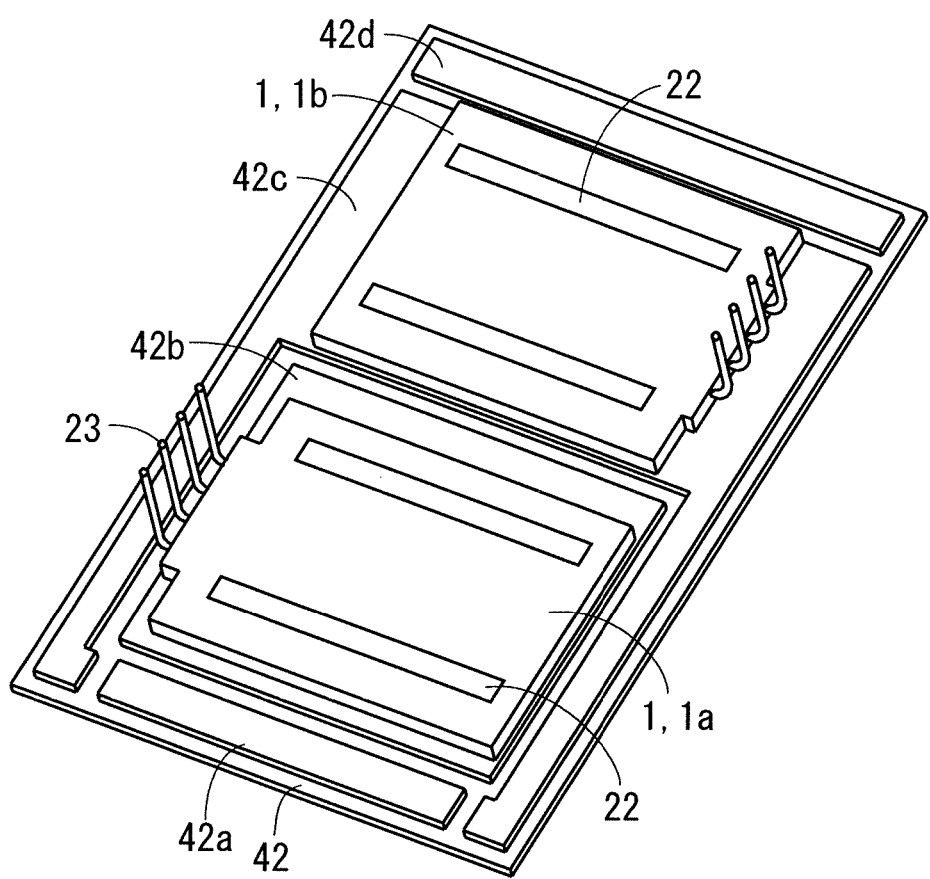
FIG. 8 is a perspective view schematically illustrating the configuration of the semiconductor device according to the first embodiment.

As illustrated in FIG. 8, the insulating substrate 42 is provided with the first circuit patterns 42a, 42b, 42c, and 42d. The first circuit patterns 42a to 42d are electrically connected to at least one of the conductive plates 21 of the plurality of sub-modules 1. In the first embodiment, the first circuit patterns 42b, 42c are electrically connected to the conductive plates 21 of the sub-modules 1a, 1b, respectively.

As illustrated in FIG. 7, the connection members 72a and 72b are electrically connected to at least one of the conductive pieces 22 of the plurality of sub-modules 1. In the first embodiment, the connection members 72a electrically connect the first circuit pattern 42a and the conductive piece 22 of the sub-module 1a, and the connection members 72b electrically connect the first circuit patterns 42b and 42d and the conductive piece 22 of the sub-module 1b. According to such a configuration, a current flows in the in-plane direction of the semiconductor device by the first circuit patterns 42a to 42d of the insulating substrate 42, and the current flows in the out-of-plane direction of the semiconductor device by each sub-module 1.

As illustrated in FIG. 6, the case 51 encloses the side surfaces S3 of the plurality of sub-modules 1. The case 51 is provided with electrodes 51a, 51b, and 51c. One side of the respective electrodes 51a and 51b is electrically connected to the first circuit pattern 42a, and the other side of the respective electrodes 51a and 51b is electrically connected to the first circuit pattern 42c. The electrode 51c is electrically connected to the first circuit pattern 42d.

As illustrated in FIG. 5, the second sealing member 41 seals the plurality of sub-modules 1, the insulating substrate 42, and the connection members 72a and 72b. In the example of FIG. 5, the second sealing member 41 is provided inside the opening of the case 51, and portions of the first control terminals 23 are exposed from the second sealing member 41. The degree of hardness of the second sealing member 41 is lower than that of the first sealing member 31, and the second sealing member 41 is more flexible than the first sealing member 31. For measuring the degree of hardness, for example, an indentation test method or the like is adopted. The material of the second sealing member 41 may include, for example, a gelatinous insulating sealing material. According to such a configuration, insulation between the external housing such as a cooling base plate (not illustrated) and the first circuit patterns 42a to 42d of the insulating substrate 42 is readily secured.

FIG. 9 is a cross-sectional view schematically illustrating connection between the first control terminals 23 of the sub-module 1 and the control substrate 61 according to the first embodiment.

The case 51 has a lid 52 along the upper surface S2 of the sub-module 1, and the lid 52 is attached to the main body of the case 51 in a manner of covering the opening of the case 51. The control substrate 61 is provided on the opposite side of the sub-module 1 with respect to the lid 52. That is, the control substrate 61 and the sub-module 1 are provided such that the lid 52 is interposed therebetween.

First control terminals 23 of sub-module 1 are electrically connected to control substrate 61. This allows the control substrate 61 to control the sub-module 1 by inputting a signal to the first control terminals 23.

In the example of FIG. 9, the first control terminals 23 are electrically connected to the control substrate 61 through through holes of the lid 52. According to such a configuration, the position of the first control terminals 23 are restricted by the through holes of the lid 52, so the positioning accuracy of the first control terminals 23 improves. As a result, the connection between the first control terminals 23 and the control substrate 61 can be readily and reliably implemented.

Note that the lid 52 may have guide portions 53 that guide the first control terminals 23 to the through holes of the lid 52. According to such a configuration, the operation of passing the first control terminals 23 through the through holes of the lid 52 is facilitated. Further, the case 51 may have a mounting portion 54 on which the control substrate 61 is mounted. According to such a configuration, the portion where the control substrate 61 and the lid 52 contact can be reduced, which reduces damage to the control substrate 61 and the lid 52.

<Manufacturing Method>

Next, a method of manufacturing the semiconductor device according to the first embodiment will be described.

First, a preparation step for preparing the plurality of sub-modules 1 described above is performed. In the preparation step, for example, the plurality of sub-modules 1 are formed. In a sealing step of forming the first sealing member 31 of the steps of forming the sub-module 1, a film that is subjected to follow-up deformation by stress may be interposed between the conductive pieces 22 and a sealing mold (not illustrated) to bring the film into close contact with the conductive pieces 22. According to such a configuration, the resin of the first sealing member 31 is suppressed from coming onto the upper surface of the conductive pieces 22.

After the preparation step of the plurality of sub-modules 1, a voltage is applied to the conductive plate 21, the conductive pieces 22, and the first control terminals 23 for each of the plurality of sub-modules 1 to conduct the electric characteristic inspection. As described above, the creepage distance among the exposed portions of the conductive pieces 22, the exposed portions of the conductive plate 21, and the exposed portions of the first control terminals 23 is expanded and this allows the screening test performed at a high voltage and high current. After the step of screening test, the step of forming the above semiconductor device is performed.

Summary of First Embodiment

The semiconductor device according to the first embodiment, the conductive plate 21 electrically connected to the drain electrode is exposed from the first sealing member 31 on the lower surface S1 side, and the conductive pieces 22 electrically connected to the source electrodes 11a are exposed from the first sealing member 31 on the upper surface S2 side. According to such a configuration, electricity can be conducted between the lower surface S1 and the upper surface S2 of the sub-module 1; therefore, the semiconductor elements 11 made of SiC can be energized in the same manner as the semiconductor element made of S1. Therefore, the semiconductor elements made of S1 can be readily replaced with the semiconductor elements 11 made of SiC.

Further, in the first embodiment, the hardness of the first sealing member 31 of the sub-module 1 is relatively high; therefore, the configuration is more tolerant against the screening test under high temperature, high voltage, and high current than a configuration without the first sealing member 31. Also, conducting the screening test under such appropriate conditions for each sub-module 1 raises the probability of removing inappropriate sub-modules 1 before assembling the semiconductor device, thereby, improving the yield of the end product, or the semiconductor device.

Further, in the first embodiment, the hardness of the second sealing member 41 is lower than that of the first sealing member 31; therefore, the stress of the entire semiconductor device can be reduced. Consequently, suppression of stress such as thermal stress and warpage associated therewith in the semiconductor device and improvement of reliability and manufacturing yield is ensured.

Also in the first embodiment, from the first sealing member 31, the conductive plates 21 are exposed on the lower surface S1 side, the conductive pieces 22 are exposed on the upper surface S2 side, and the first control terminals 23 are exposed on the side surface S3. According to such a configuration, the creepage distance among the exposed portions of the conductive pieces 22, the exposed portions of the conductive plate 21, and the exposed portions of the first control terminals 23 is expanded and this allows a screening test performed at a high voltage and high current. In addition, the first control terminals 23 being exposed from the first sealing member 31 on the side surface S3 improves the degree freedom in the number and design of the connection members 72a and 72b connected to the conductive pieces 22.

Also, when the material of a semiconductor element contains SiC, the defect density of the wafer base material of the semiconductor element is typically higher than that of Si, which makes an increase in the chip size of the semiconductor element difficult, restricting the electrode area of the semiconductor device by the restricted chip size. Therefore, in each of the semiconductor elements 11 composed of SiC, enough areas to which connection members such as wires and ribbons are to be connected are not secured. However, by providing the conductive piece 22 across the source electrodes 11a of the plurality of semiconductor elements 11, the connection areas are not the source electrode 11a of the semiconductor element 11, but the conductive piece 22 which is wider than the source electrode 11a, leading to securing enough connection areas.

Furthermore, in the first embodiment, the sub-module 1 is provided with the first control terminals 23; therefore, connection to the control substrate 61 is ensured without providing another control terminal. Consequently, the manufacturing cost of the semiconductor device can be suppressed.

Second Embodiment

FIG. 10 is a cross-sectional view schematically illustrating connection between first control terminals 23 of a sub-module 1 and a control substrate 61 according to a second embodiment.

The semiconductor device according to the second embodiment includes a case 51, the control substrate 61, wires 73, and second control terminals 81. The case 51 and the control substrate 61 according to the second embodiment are mostly similar to the case 51 and the control substrate 61 according to the first embodiment.

The exposed portion of the first control terminal 23 includes an end portion 23b which is exposed from the side surface of the first sealing member 31 corresponding to the side surface S3 of the sub-module 1 and is subjected to bending to be placed on the upper surface S2 of the sub-module 1.

The second control terminal 81 has a first end portion 81a and a second end portion 81b and is provided in the case 51. The control substrate 61 is electrically connected to the first end portion 81a of the second control terminals 81. The wires 73 electrically connect end portions 23b of first control terminals 23 and the second end portions 81b of the second control terminals 81.

The semiconductor device according to the second embodiment described above, the first control terminals 23 are electrically connected to the control substrate 61 via the second control terminals 81 provided in the case 51. According to such a configuration, the positioning accuracy of the second control terminals 81 improves more than the positioning accuracy of the first control terminals 23 of FIG. 9.

Third Embodiment

FIG. 11 is a cross-sectional view schematically illustrating connection between first control terminals 33 of a sub-module 1 and a control substrate 61 according to a third embodiment.

The semiconductor device according to the third embodiment includes the control substrate 61, and third control terminals 82. The control substrate 61 according to the third embodiment is mostly similar to the control substrate 61 according to the first embodiment.

The insulating substrate 42 is provided with not only the first circuit patterns 42b and 42c described in the first embodiment, but also a second circuit pattern 42e. The exposed portions of the first control terminals 23 is exposed from the side surface of the first sealing member 31 corresponding to the side surface S3 of the sub-module 1 and is electrically connected to the second circuit pattern 42e.

The third control terminal 82 has a first end portion 82a and a second end portion 82b, and the first end portion 82a is electrically connected to the second circuit pattern 42e. The control substrate 61 is electrically connected to the second end portions 82b of the third control terminals 82.

The semiconductor device according to the third embodiment described above, the first control terminals 23 are electrically connected to the control substrate 61 via the third control terminals 82 connected to the second circuit pattern 42e. According to such a configuration, having a configuration similar to a typical semiconductor device in which the control terminals are connected to the circuit pattern, standardization of the design of the semiconductor device according to the third embodiment and the design of the typical semiconductor device is implemented. And such standardization enables standardizing of the peripheral members, leading to the cost reduction in the semiconductor device and shortening of the development period thereof.

Fourth Embodiment

Figure 12:
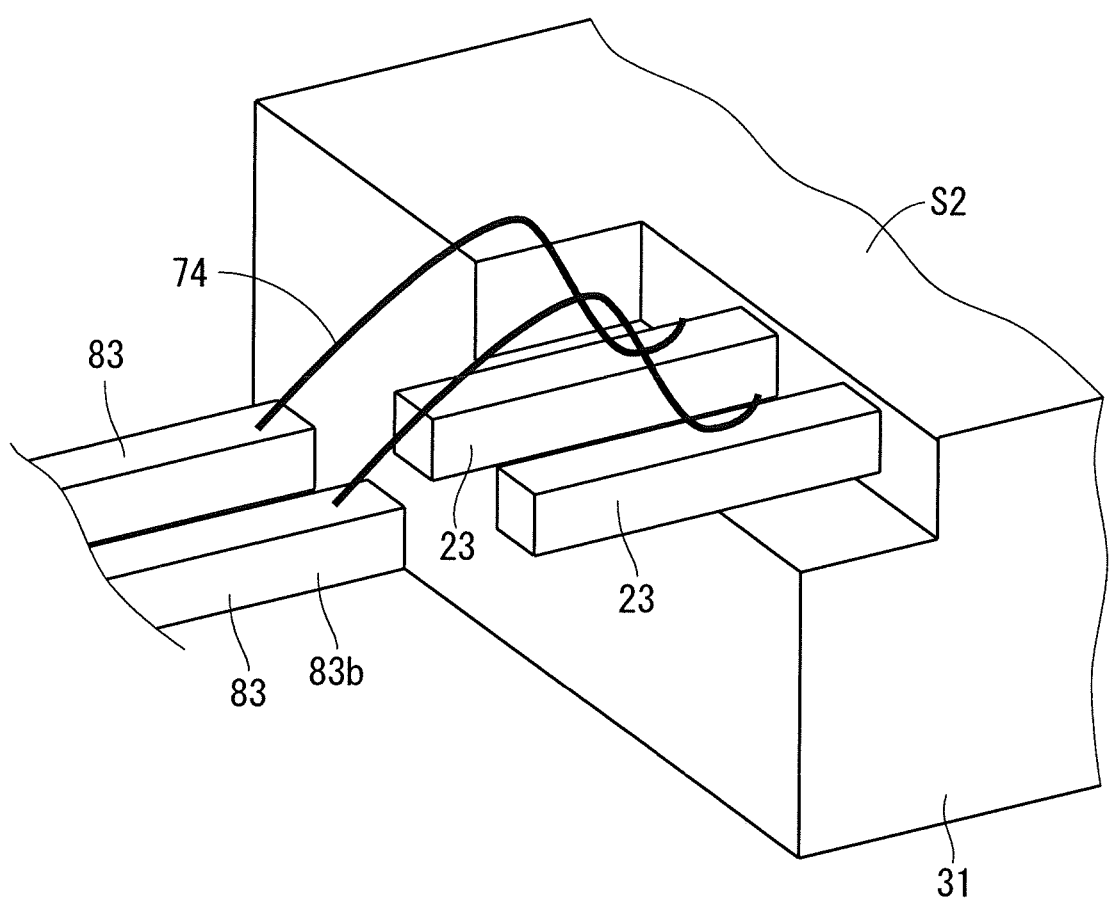
FIG. 12 is an enlarged perspective view schematically illustrating a configuration of a semiconductor device according to a fourth embodiment.

FIG. 12 is an enlarged perspective view schematically illustrating first control terminals 23 of a sub-module 1 according to a fourth embodiment.

The semiconductor device according to the fourth embodiment includes a control substrate (now illustrated), wires 74 being conductive members, and fourth control terminals 83. The control substrate according to the fourth embodiment is mostly similar to the control substrate 61 according to the first embodiment.

The exposed portions of the first control terminals 23 are exposed from a notch in the boundary portion of the first sealing member 31 corresponding to the boundary portion between the upper surface S2 and the side surface S3 of the sub-module 1. A surface of the exposed portion of the first control terminal 23 on the lower surface S1 side is fixed to the first sealing member 31.

The fourth control terminal 83 has a first end portion and a second end portion 83b and is apart from the sub-module 1. The control substrate is electrically connected to the first end portions of the fourth control terminals 83. The wires 74 electrically connect the exposed portions of the first control terminals 23 and the second end portions 83b of fourth control terminals 83.

The semiconductor device according to the fourth embodiment described above, the portions exposed from the notch of the first control terminals 23 are electrically connected to the control substrate via the fourth control terminals 83 as with the second embodiment. According to such a configuration, substantially the same configuration and effects as those of the second embodiment is implemented without bending the first control terminals 23 as in the second embodiment. Also, direct connection of the wires 74 to the sub-module 1 is ensured.

Fifth Embodiment

Figure 13:
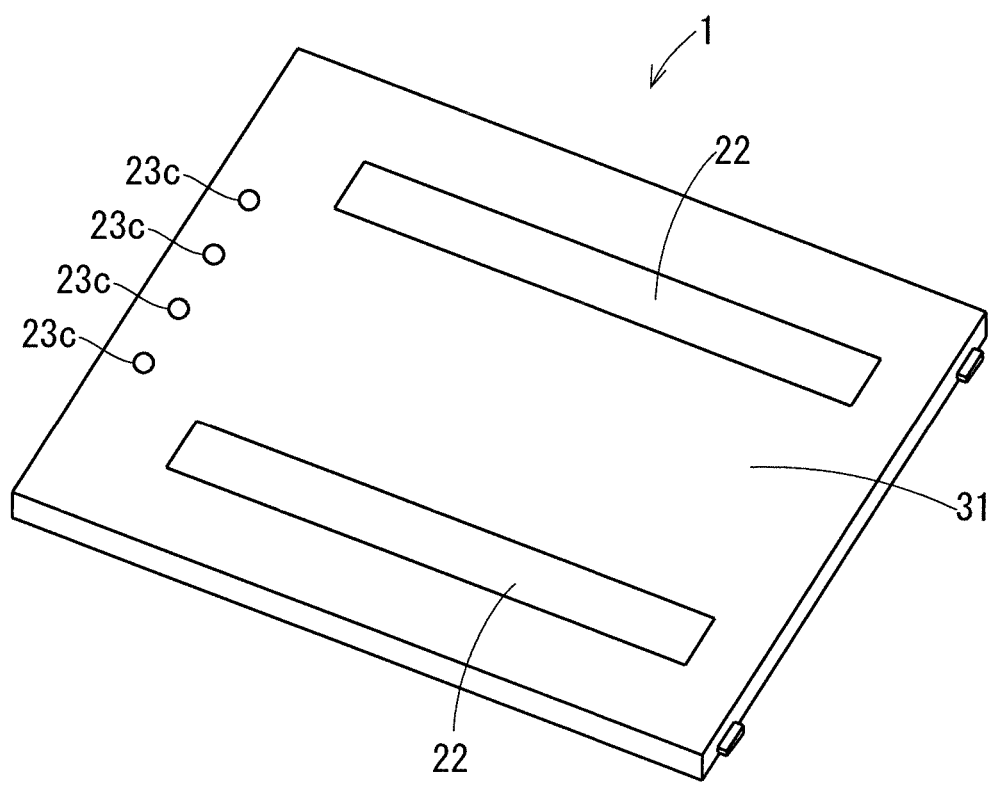
FIG. 13 is a perspective view schematically illustrating a configuration of a sub-module according to a fifth embodiment.
Figure 14:
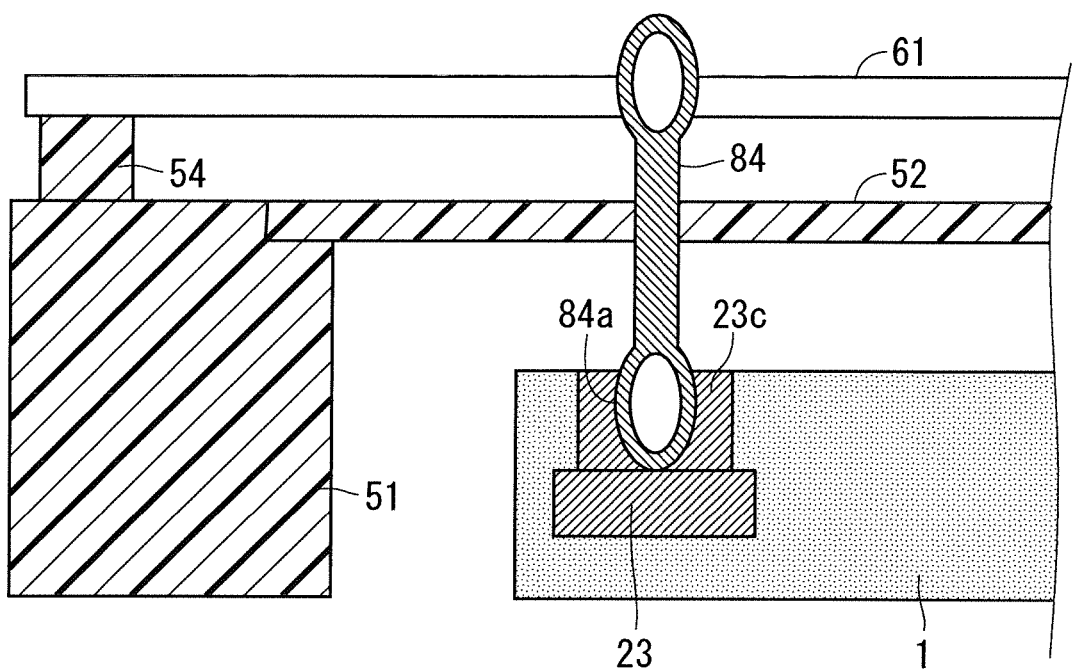
FIG. 14 is a cross-sectional view schematically illustrating the configuration of the semiconductor device according to the fifth embodiment.

FIG. 13 is an enlarged perspective view schematically illustrating a configuration of a sub-module 1 according to a fifth embodiment. FIG. 14 is a cross-sectional view schematically illustrating connection between first control terminals 23 of the sub-module 1 and a control substrate 61 according to the fifth embodiment.

The semiconductor device according to the fifth embodiment includes the control substrate 61, and fifth control terminals 84. The control substrate 61 according to the fifth embodiment is mostly similar to the control substrate 61 according to the first embodiment.

As illustrated in FIGS. 13 and 14, in the fifth embodiment, a metal cylindrical portion 23c, which is the exposed portion of the first control terminal 23, is exposed from the upper surface of the first sealing member 31 corresponding to the upper surface S2 of the sub-module 1. The material of the metal cylindrical portion 23c may be any material as long as it has conductivity, and includes copper, for example.

According to such a semiconductor device according to the fifth embodiment, providing the fifth control terminals 84 with an elastic portion 84a having a width wider than that of other portions as illustrated in FIG. 14 enables to press-fit connect the elastic portion 84a and the metal cylindrical portion 23c. According to such a configuration, the first control terminals 23 and the fifth control terminals 84 can be readily connected, so that the assemblability of the semiconductor device can be improved.

It should be noted that, as illustrated in FIG. 14, the fifth control terminals 84 and the control substrate 61 may be similarly press-fit connected. Although not illustrated, the conductive pieces 22 of FIG. 8 may be provided with metal cylindrical portions similar to the metal cylindrical portions 23c, and the connection members 72a and 72b of FIG. 7 may be provided with elastic portions similar to the elastic portions 84a to press-fit connect the conductive pieces 22 and the connection members 72a and 72b. Even in these cases, the assemblability of the semiconductor device can be improved.

Sixth Embodiment

In the first embodiment, two conductive pieces 22 are provided for one sub-module as illustrated in FIG. 1, and the two conductive pieces 22 are connected by the connection members 72a as illustrated in FIG. 7. However, when a current flows in the configuration illustrated in FIG. 7, a potential difference is generated between the two conductive pieces 22 due to the resistance of the connection members 72a. As a result, a difference is generated between the applied voltage between the gate and the source of the semiconductor element 11 connected to one conductive piece 22 and the applied voltage of the semiconductor element 11 connected to an other conductive piece 22, resulting in possible ununiformity in operation in one sub-module 1. Meanwhile, in the semiconductor device according to the sixth embodiment, suppression of such ununiformity in operation is ensured as described below.

Figure 15:
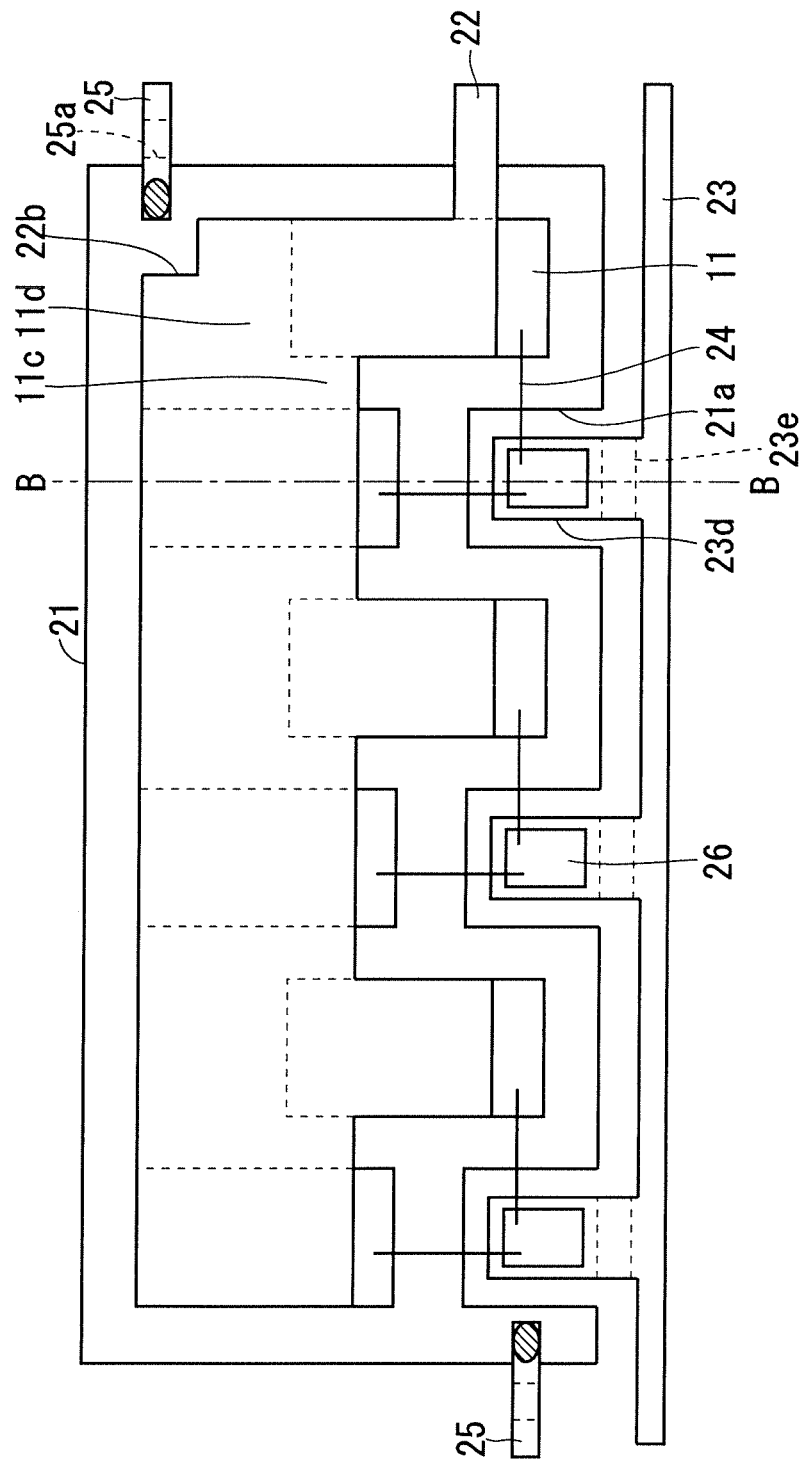
FIG. 15 is a plan view schematically illustrating a configuration of a sub-module according to a sixth embodiment.
Figure 16:
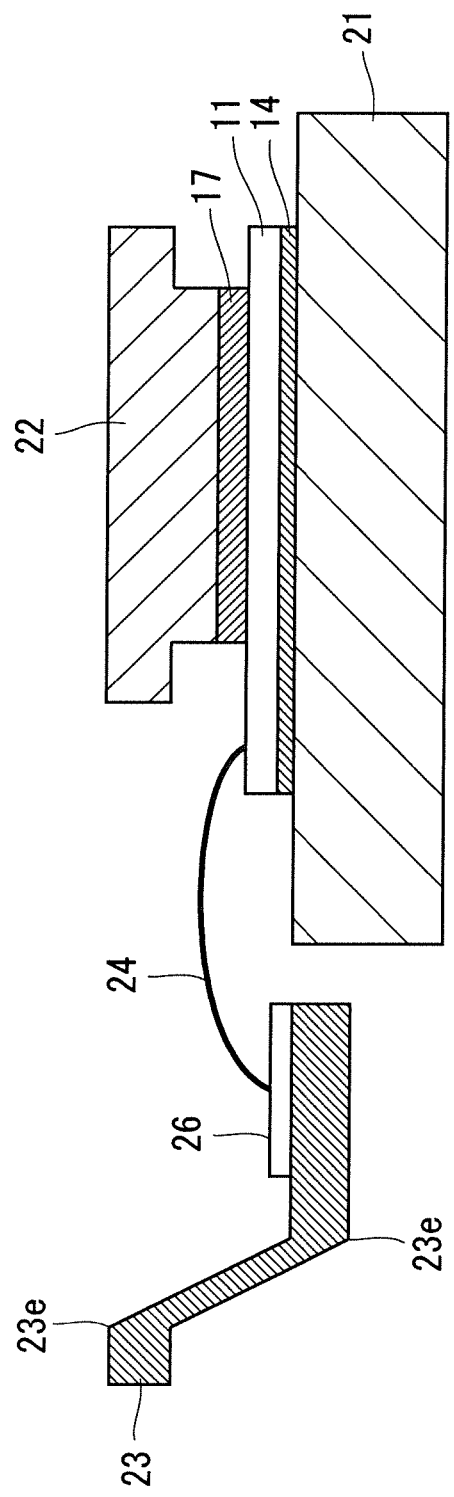
FIG. 16 is a cross-sectional view schematically illustrating the configuration of the sub-module according to the sixth embodiment.
Figure 17:
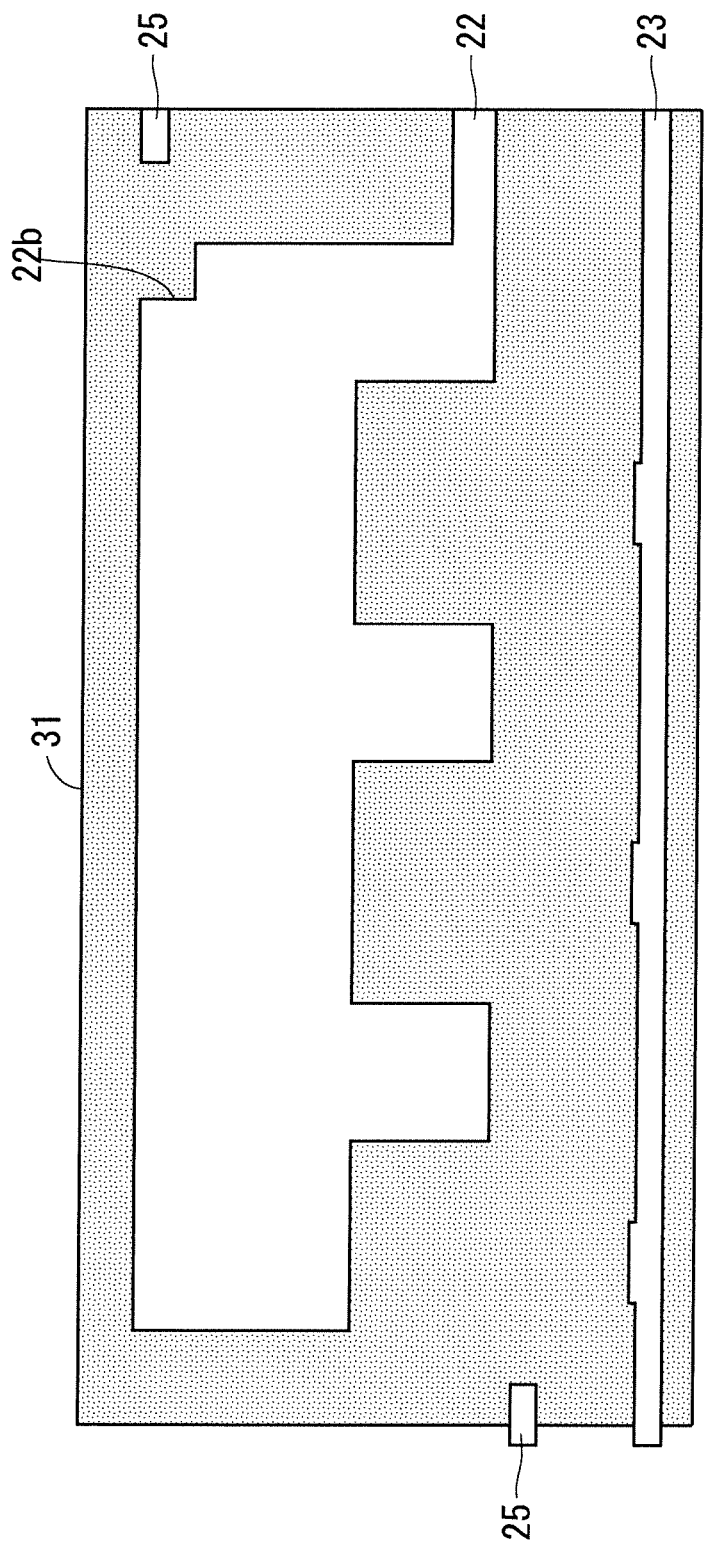
FIG. 17 is a plan view schematically illustrating the configuration of the sub-module according to the sixth embodiment.

FIG. 15 is a plan view schematically illustrating a configuration of the sub-module 1 according to the sixth embodiment from which the first sealing member 31 is removed, and FIG. 16 is a cross-sectional view of a configuration of the sub-module 1 along the line B-B of FIG. 15. FIG. 17 is a plan view schematically illustrating the configuration of the sub-module 1 according to the sixth embodiment.

Dotted lines drawn in the conductive piece 22 in FIG. 15 indicate the semiconductor element 11 that is hidden thereby. As illustrated in FIG. 15, the plurality of semiconductor elements 11 are arranged in a row in plan view. Hereinafter, the direction in which the plurality of semiconductor elements 11 are arranged (horizontal direction in FIG. 15) is referred to as the arrangement direction. It should be noted that the arrangement in a row indicates that the plurality of semiconductor elements 11 are not provided in multiple rows.

The semiconductor elements 11 have a rectangular shape having long sides in a direction that is different from the arrangement direction in plan view. In the example of FIG. 15, although the semiconductor elements 11 extend in the vertical direction perpendicular to the arrangement direction, it is not limited thereto. Also in the example of FIG. 15, although each semiconductor elements 11 have a rectangular shape in plan view, the shape is not limited thereto. Further, in the example of FIG. 15, although the number of the plurality of semiconductor elements 11 is six, the number thereof is not limited thereto, and may be, for example, ten as in the first embodiment.

According to the configuration of the semiconductor device according to the sixth embodiment as described above, the plurality of semiconductor elements 11 are arranged in a row, thereby ensuring the connection with one conductive piece 22. Also, no energization occurs in one conductive piece 22 in the arrangement direction; therefore, suppression of the occurrence of a potential difference in the arrangement direction within the conductive piece 22 is ensured. Consequently, differences in applied voltage to the plurality of semiconductor elements 11 in one sub-module 1 can be reduced, thereby reducing the possible ununiformity in operation. In addition, the semiconductor elements 11 have a rectangular shape having long sides in a direction that is different from the arrangement direction in plan view, the shape of the sub-module 1 in plan view does not become excessively long in the horizontal direction of FIG. 15, maintaining the typical aspect ratio.

Further, in the sixth embodiment, the crystal orientation of SiC of semiconductor element 11 is adjusted so that a defect extension direction of semiconductor element 11 corresponds to the lateral direction (short side direction) of the shape of the semiconductor element 11 in plan view. The defect extension direction referred to here is the direction in which defects are likely to extend due to bipolar energization or the like in a semiconductor device containing SiC. According to such a configuration, the defect expansion of the semiconductor element 11 is suppressed.

Further, in the sixth embodiment, the plurality of semiconductor elements 11 are provided in a zigzag pattern along the arrangement direction in which the plurality of semiconductor elements 11 are arranged. In a region 11c between two adjacent semiconductor elements 11, heat generated from each of the adjacent semiconductor elements 11 causes thermal interference in which the temperature rises. The arrangement of the plurality of semiconductor elements 11 in a zigzag pattern along the arrangement direction allows reduction in the region 11c between two adjacent semiconductor elements 11, thereby reducing thermal interference. This effect is particularly effective in a configuration in which a conductive plate made of copper or the like that promotes heat diffusion is used as the conductive plate 21.

Further, in the sixth embodiment, the conductive plate 21 has concave portions 21a in plan view, and the first control terminal 23 have convex portions 23d surrounded by the concave portions 21a in plan view. According to such a configuration, even if the plurality of semiconductor elements 11 are arranged in a zigzag pattern along the arrangement direction, the distance between each of the plurality of semiconductor elements 11 and the first control terminal 23 can be made the same as much as possible. Therefore, the impedance of the wires 24 can be made as uniform as possible; therefore, the difference in voltage applied to the gates of the plurality of semiconductor elements 11 can be suppressed.

The semiconductor device according to the sixth embodiment further includes drain sense terminals 25 connected to the conductive plate 21. In the example of FIG. 15, the portions at which the conductive plate 21 and the drain sense terminal 25 are connected is hatched with oblique lines. The drain sense terminal 25 is a terminal for detecting the current flowing through the drain of the semiconductor elements 11, and for example, the drain sense terminal 25 can implement protection such as suspending energization to the semiconductor elements 11 when the current is not within a certain range.

Further, in the sixth embodiment, the drain sense terminal 25 is connected to a region 11d adjacent to the two semiconductor elements 11, which is not the region 11c between the two adjacent semiconductor elements 11, among the regions on the conductive plate 21. According to such a configuration, the drain sense terminal 25 and the conductive plate 21 can be connected at positions as far away from the semiconductor element 11 as possible. Consequently, effective utilization of the regions created by providing the plurality of semiconductor elements 11 in a zigzag pattern is implemented, and expansion of the creepage distance between the drain sense terminal 25 and the conductive piece 22 is ensured.

Further, the semiconductor device according to the sixth embodiment includes gate resistance elements 26. The gate resistance elements 26 are provided in portions in the first control terminal 23 facing the semiconductor elements 11 in plan view, and each are connected between control terminal 23 and semiconductor element 11. The gate resistance element 26 is, for example, a laminated body of a silicon film, a silicon oxide film, and a polysilicon film, and has a relatively large resistance. Although not illustrated, an electrode for wire bonding is provided on the upper surface of the gate resistance element 26. In the example of FIG. 15, the gate resistance elements 26 are provided on the convex portions 23d of the first control terminal 23, and the upper surfaces of the gate resistance elements 26 are connected to the semiconductor elements 11 by the wires 24. According to such a configuration, the difference in threshold voltage Vth between the plurality of semiconductor elements 11 can be ignored, so that the difference in operation timing caused by the difference in threshold voltage Vth can be reduced.

Note that in a case where elements having the same function as the gate resistance elements 26 are provided in a circuit outside the sub-module 1, the distance between the gate resistance elements 26 and the semiconductor elements 11 increases, leading to being subjected to the influence of the resistance of the first control terminal 23. In contrast, according to the sixth embodiment, the gate resistance element 26 is connected between the first control terminal 23 and the semiconductor element 11, the influence of the resistance of the first control terminal 23 can be suppressed. Further, in a case where an element having the same function as the gate resistance element 26 is provided inside the semiconductor element 11, the per area in the substrate of the semiconductor element 11 costs high, raising the cost of the semiconductor device. In contrast, according to the sixth embodiment, the gate resistance elements 26 are provided outside the semiconductor elements 11; therefore, the cost is suppressed.

Further, in the sixth embodiment, the thickness of first control terminal 23 is smaller than the thickness of the conductive plate 21, as illustrated in FIG. 16. By making the thickness of the first control terminal 23 relatively small in this manner, the first control terminal 23 can be suppressed from exposing from the lower surface of the first sealing member 31 corresponding to the lower surface S1 of the sub-module 1 even if the thickness of the first control terminal 23 or the position in the thickness direction is slightly deviated. Also, the bending process for providing bent portions 23e in the first control terminal 23 can be readily performed. Meanwhile, by making the thickness of the conductive plate 21 relatively large, the conductive plate 21 can be readily exposed from the lower surface of the first sealing member 31 corresponding to the lower surface S1 of the sub-module 1. Also, heat diffusion by the conductive plate 21 can be promoted.

Further, in the sixth embodiment, as with the bent portions 23e of the first control terminal 23, the drain sense terminal 25 is also provided with the bent portion 25a. Accordingly, as illustrated in FIG. 17, the exposed portion of the conductive piece 22, the exposed portion of the first control terminal 23, and the exposed portions of the drain sense terminals 25 are exposed from the upper surface of the first sealing member 31 corresponding to the upper surface of the sub-module 1. According to such a configuration, the electrical connection of the sub-module 1 can be implemented in the same manner as the electrical connection of the semiconductor elements 11.

Figure 18:
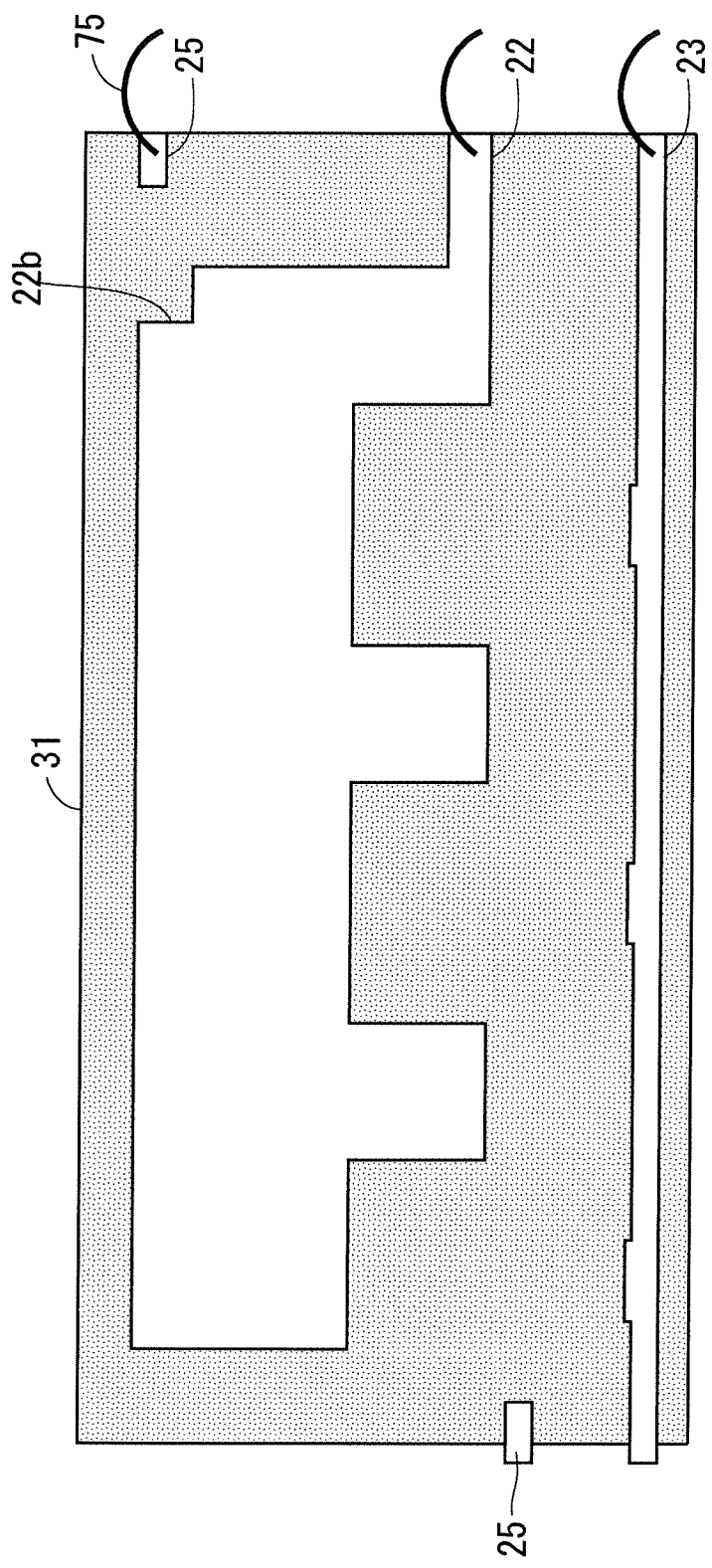
FIG. 18 is a plan view schematically illustrating the configuration of the sub-module according to the sixth embodiment.
Figure 19:
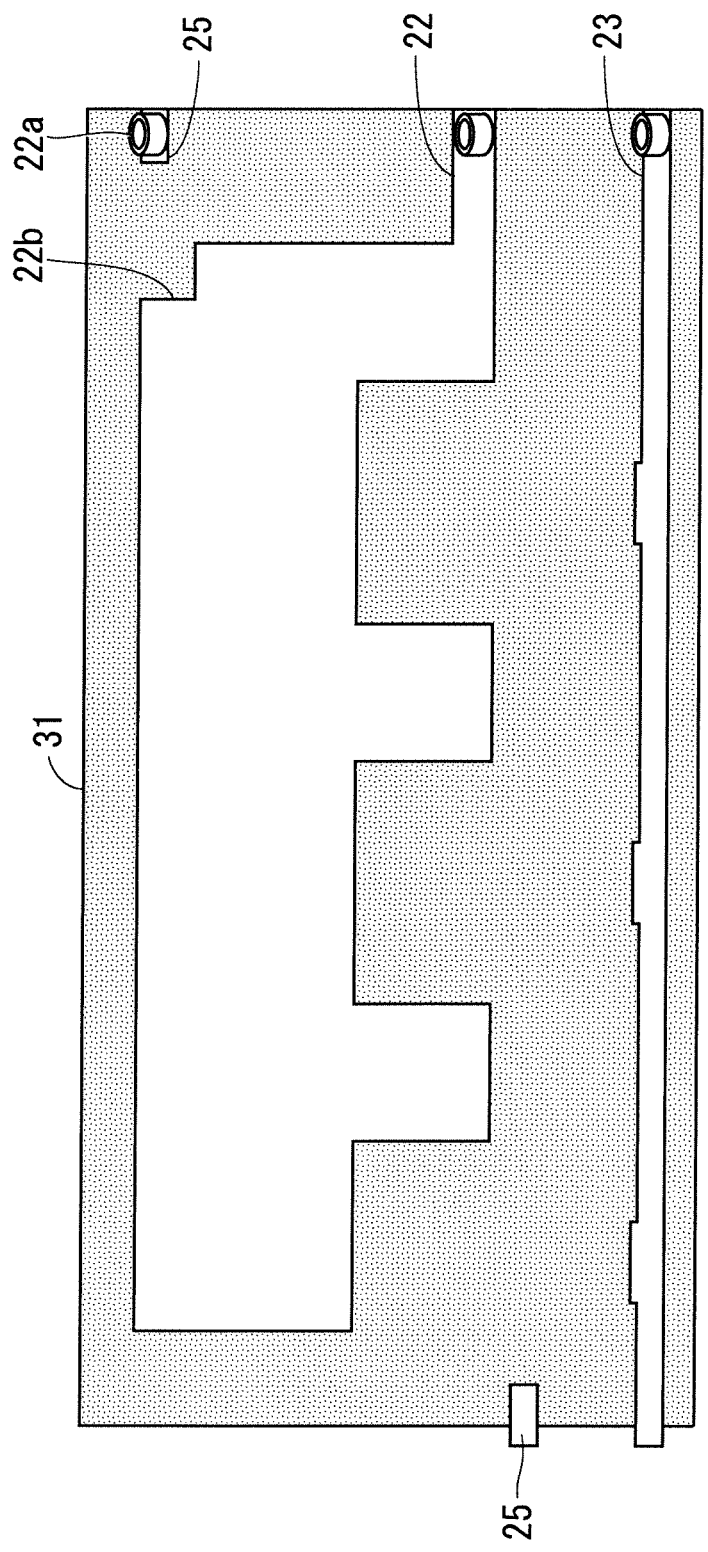
FIG. 19 is a plan view schematically illustrating the configuration of the sub-module according to the sixth embodiment.

According to the configuration of FIG. 17 facilitates wire bonding, and this allows to readily form a configuration in which each of the exposed portion of the conductive piece 22, the exposed portion of the first control terminal 23, and the exposed portion of the drain sense terminal, as illustrated in FIG. 18 is connected to the wire 75. Alternatively, the configuration also facilitates press-fit connection, and this allows to readily form a configuration in which each of the exposed portion of the conductive piece 22, the exposed portion of the first control terminal 23, and the exposed portion of the drain sense terminal, as illustrated in FIG. 19 is press-fit connected. In FIG. 19, a metal cylindrical portion 22a similar to the metal cylindrical portion 23c of FIG. 14 for press-fit connection is provided at the exposed portion of the conductive piece 22.

Although not illustrated, the exposed portion of the conductive piece 22, the exposed portion of the first control terminal 23, and the exposed portion of the drain sense terminal may be bent so as to stand from the upper surface of the first sealing member 31. According to the configuration using the press-fit connection and the configuration in which the exposed portions are bent, providing a circuit or the like in the horizontal direction of the sub-module 1 is not required, reducing the semiconductor device in size in plan view.

Further, in the sixth embodiment, the exposed portion of the conductive piece 22 has a concave portion 22b in plan view, and the exposed portion of the drain sense terminal 25 is provided to face the concave portion 22b as illustrated in FIG. 17. According to such a configuration, the creeping distance between the drain sense terminal 25 and the conductive piece 22 increases, so that the screening test can be performed at high voltage and high current. In the example of FIG. 17, although the concave portion 22b is provided at the corner portion of the exposed portion of the conductive piece 22, it is not limited thereto.

Also, in the sixth embodiment, the exposed portion of the first control terminal 23 is provided from the left end to the right end of the first sealing member 31 in plan view. According to such a configuration, for example, in the configuration as illustrated in FIGS. 18 and 19, a probe needle for performing a screening test is readily attached to a portion of the first control terminal 23 where the wire 75 and the metal cylindrical portion 22a are not provided.

Figure 20:
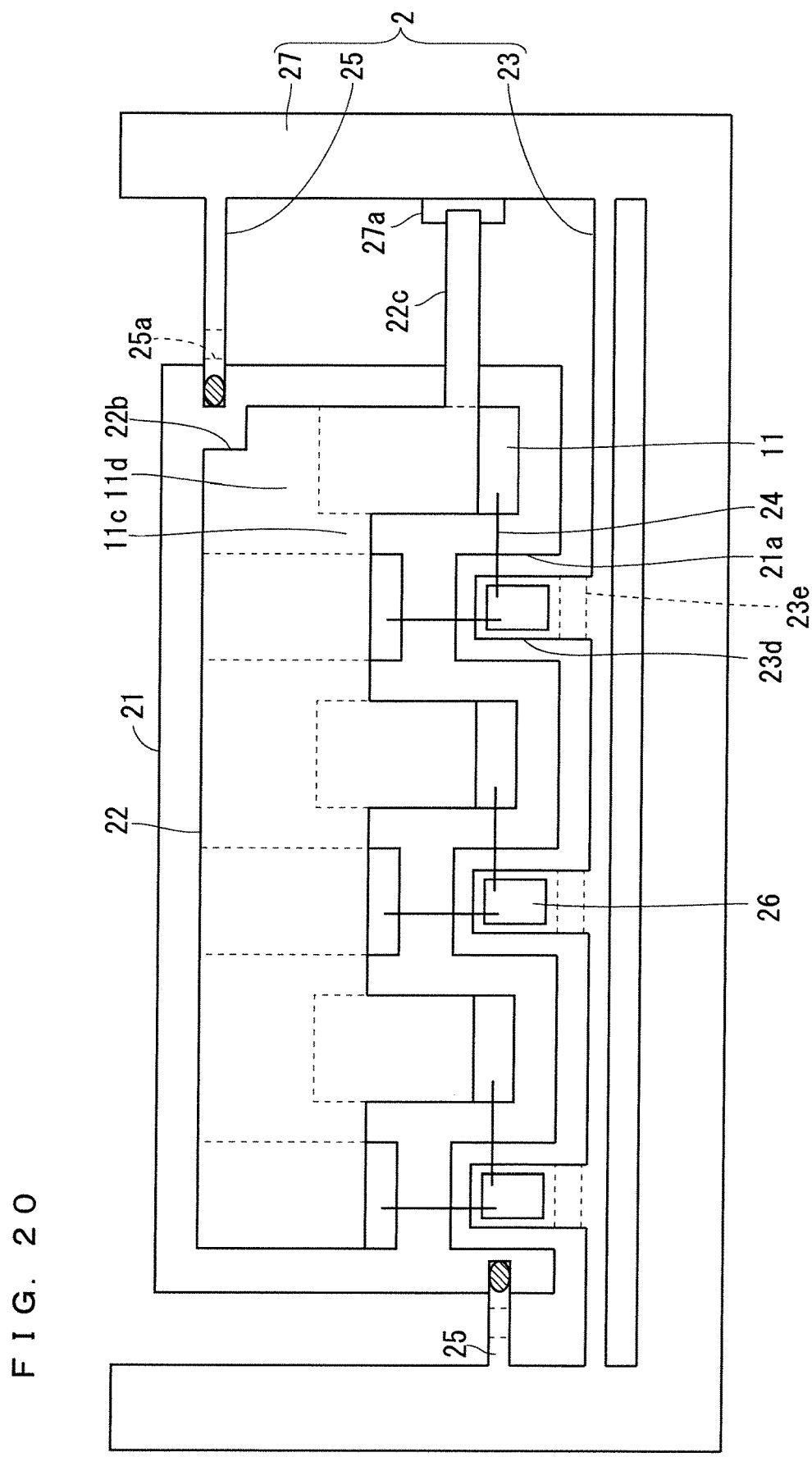
FIG. 20 is a plan view schematically illustrating a manufacturing step of the sub-module according to the sixth embodiment.

FIG. 20 is a plan view schematically illustrating a manufacturing step of the sub-module 1 according to the sixth embodiment. First, a metal pattern 2 including the first control terminal 23, the drain sense terminals 25, and a frame 27 is prepared. The first control terminal 23 and the drain sense terminals 25 are integrated with the frame 27, while the conductive piece 22 is not integrated with the frame 27. The conductive piece 22 has a source terminal 22c protruding from the side surface of the first sealing member 31, and the source terminal 22c is placed on a holding portion 27a that is a portion of the frame 27. The metal pattern 2 is formed by punching, for example. Note that the thickness of the metal pattern 2 is smaller than the thickness of the conductive plate 21.

After preparing the metal pattern 2, the portion of the metal pattern 2 to become the drain sense terminal 25 and the conductive plate 21 are connected to each other. In parallel with or before or after this, the plurality of semiconductor elements 11, the conductive plate 21, and the conductive piece 22 are connected to one another. Then, the first control terminal 23 and the drain sense terminals 25 are separated from the frame 27 after forming the first sealing member 31.

According to such a configuration, the first control terminal 23 is separated from the frame 27 after the first sealing member 31 is formed in a state in which the position of the first control terminal 23 with respect to the conductive plate 21 is fixed by the frame 27. With this, displacement of the first control terminal 23 with respect to the conductive plate 21 can be suppressed. Further, the drain sense terminal 25 can be formed from the portion of the frame 27 connected to the conductive plate 21; therefore, effective utilization of the material of the frame 27 is ensured.

Further, in the sixth embodiment, the process temperature when assembling a semiconductor device from the plurality of sub-modules 1 is lower than the melting point of the connection portion connecting the metal pattern 2 and the conductive plate 21. According to such a configuration, connection failure between the drain sense terminal 25 and the conductive plate 21 can be avoided from occurring when assembling a semiconductor device from the plurality of sub-modules 1.

First Modification

Figure 21:
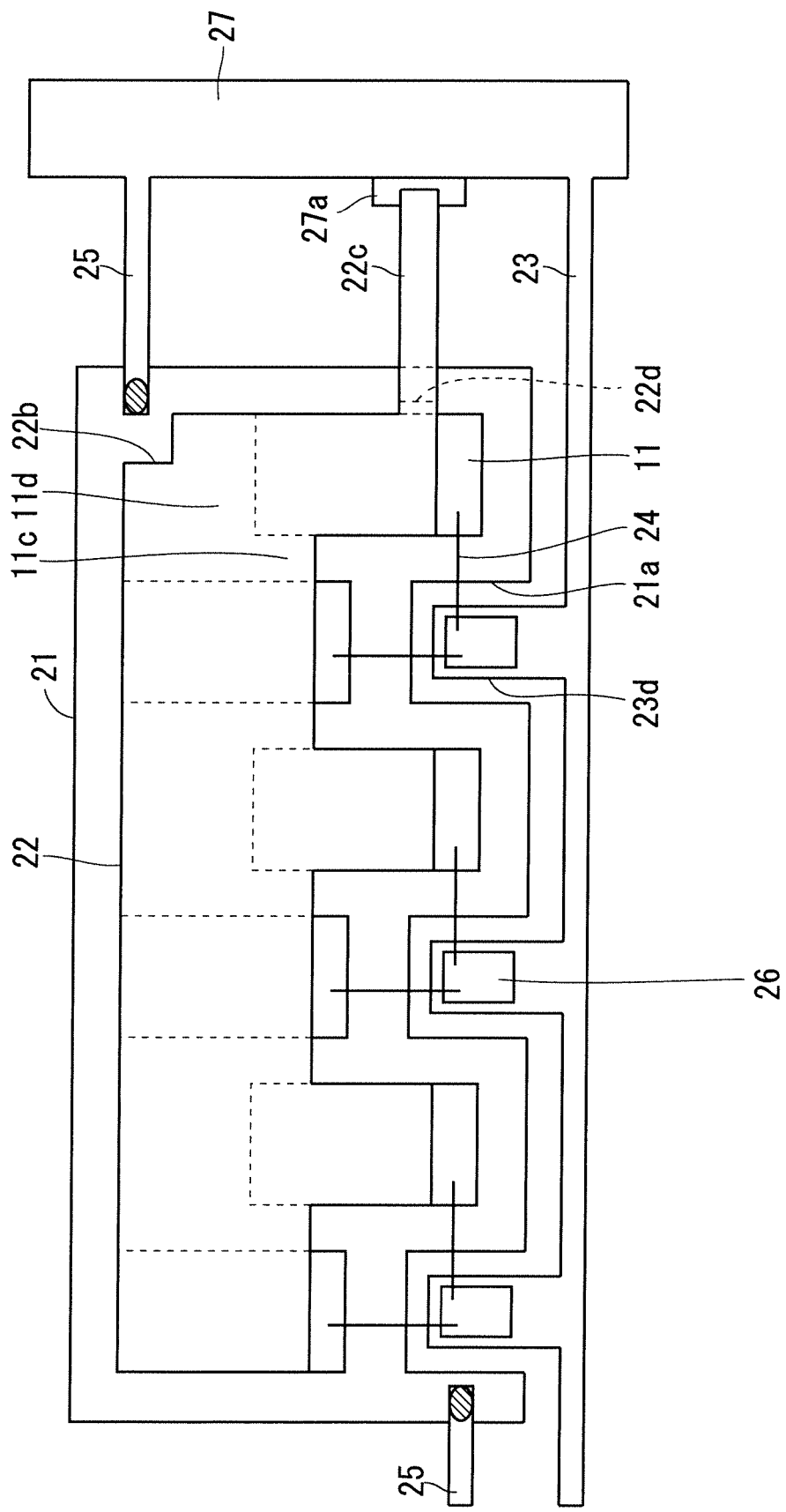
FIG. 21 is a plan view schematically illustrating a manufacturing step of the sub-module according to a first modification of the sixth embodiment.
Figure 22:
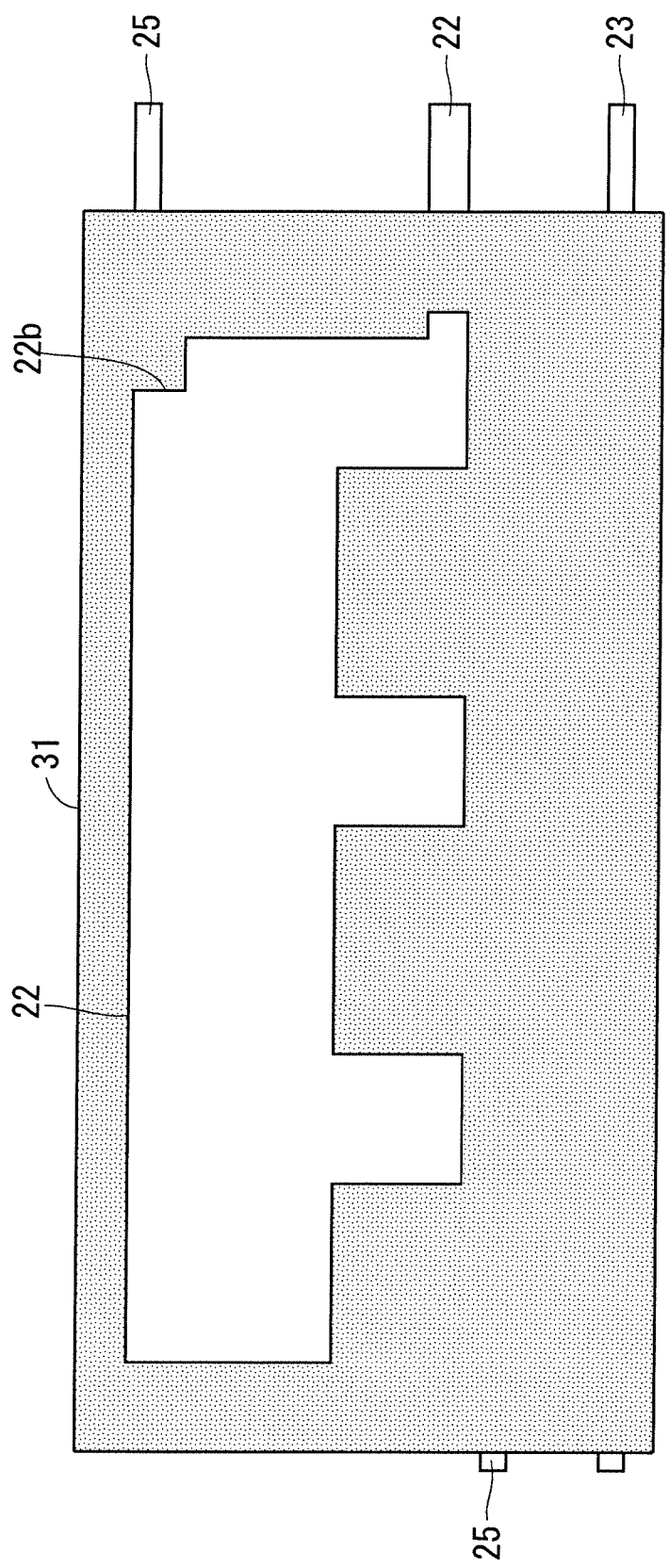
FIG. 22 is a plan view schematically illustrating a manufacturing step of the sub-module according to the first modification of the sixth embodiment.

FIGS. 21 and 22 are plan views schematically illustrating manufacturing steps of the sub-module 1 according to the sixth embodiment. The sub-module 1 according to a first modification of the sixth embodiment differs from the sub-module 1 according to the sixth embodiment in that the positions at which the signal and power are extracted are different.

In the first modification, the drain sense terminal 25 protrudes from the side surface of the first sealing member 31, and the drain sense terminal 25 is not provided with the bent portion 25a. The first control terminal 23 protrudes from the side surface of the first sealing member 31, and the first control terminal 23 is not provided with the bent portion 23e. The conductive piece 22 has a source terminal 22c protruding from the side surface of the first sealing member 31, and the source terminal 22c is provided with a bent portion 22d. The positions of the drain sense terminal 25 and the first control terminal 23 in the thickness direction are substantially the same. Meanwhile, these positions are different from the position of the source terminal 22c in the thickness direction, and the source terminal 22c and the conductive plate 21 are separated from each other. In order to secure such a positional difference, the frame 27 is provided with a holding portion 27a for holding the end portion of the source terminal 22c.

After the structure of FIG. 21 is formed, the first sealing member 31 is formed as illustrated in FIG. 22, and then the first control terminal 23 and the drain sense terminals 25 are separated from the frame 27. After that, the portions exposed from the first sealing member 31, that is, the exposed portion of the source terminal 22c, the exposed portion of the first control terminal 23, and the exposed portion of the drain sense terminal 25 are bent toward either on the front side or the back side of FIG. 22. According to such a configuration, providing a circuit or the like in the horizontal direction of the sub-module 1 is not required, reducing the semiconductor device in size in plan view.

Second Modification

Figure 23:
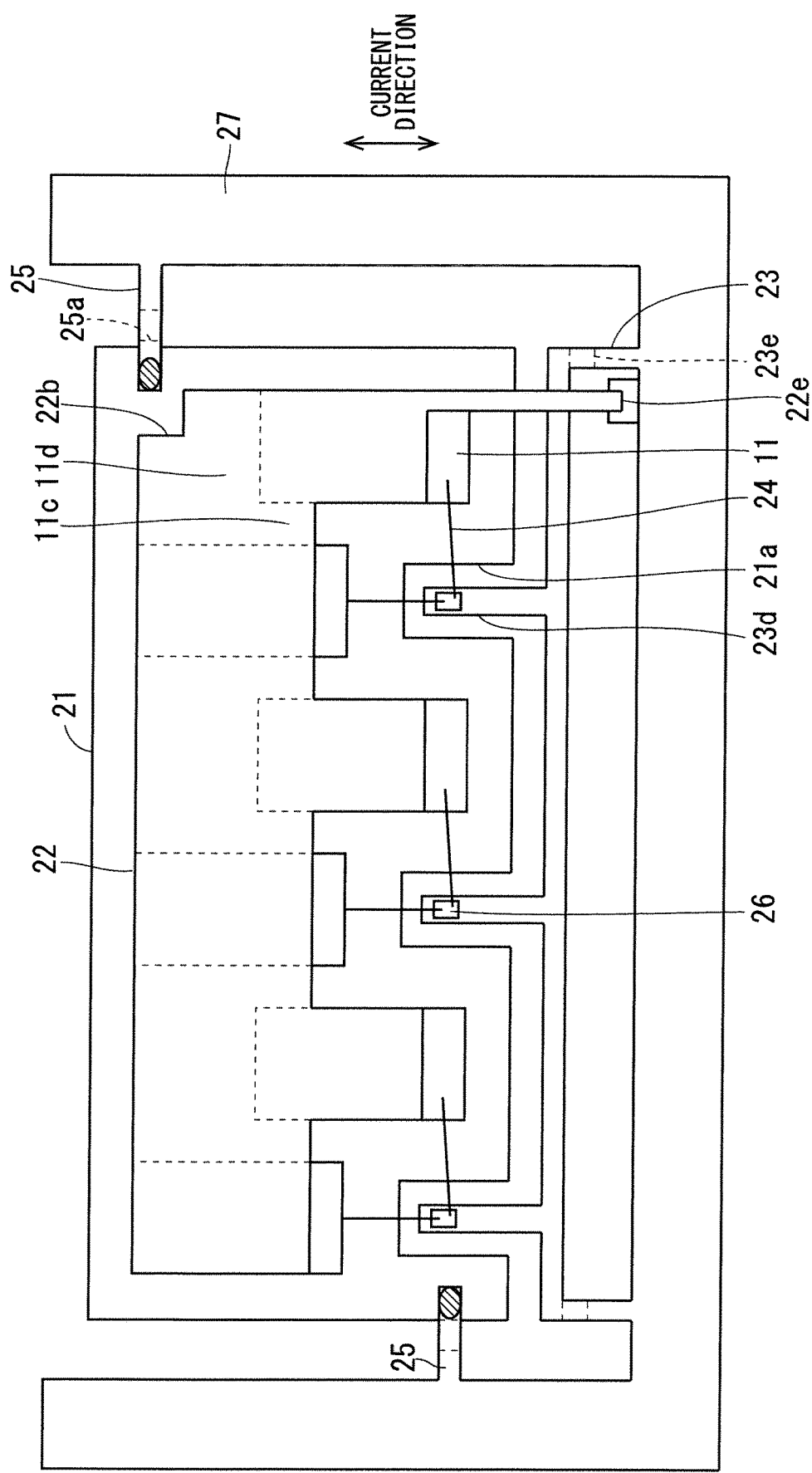
FIG. 23 is a plan view schematically illustrating a manufacturing step of the sub-module according to a second modification of the sixth embodiment.
Figure 24:
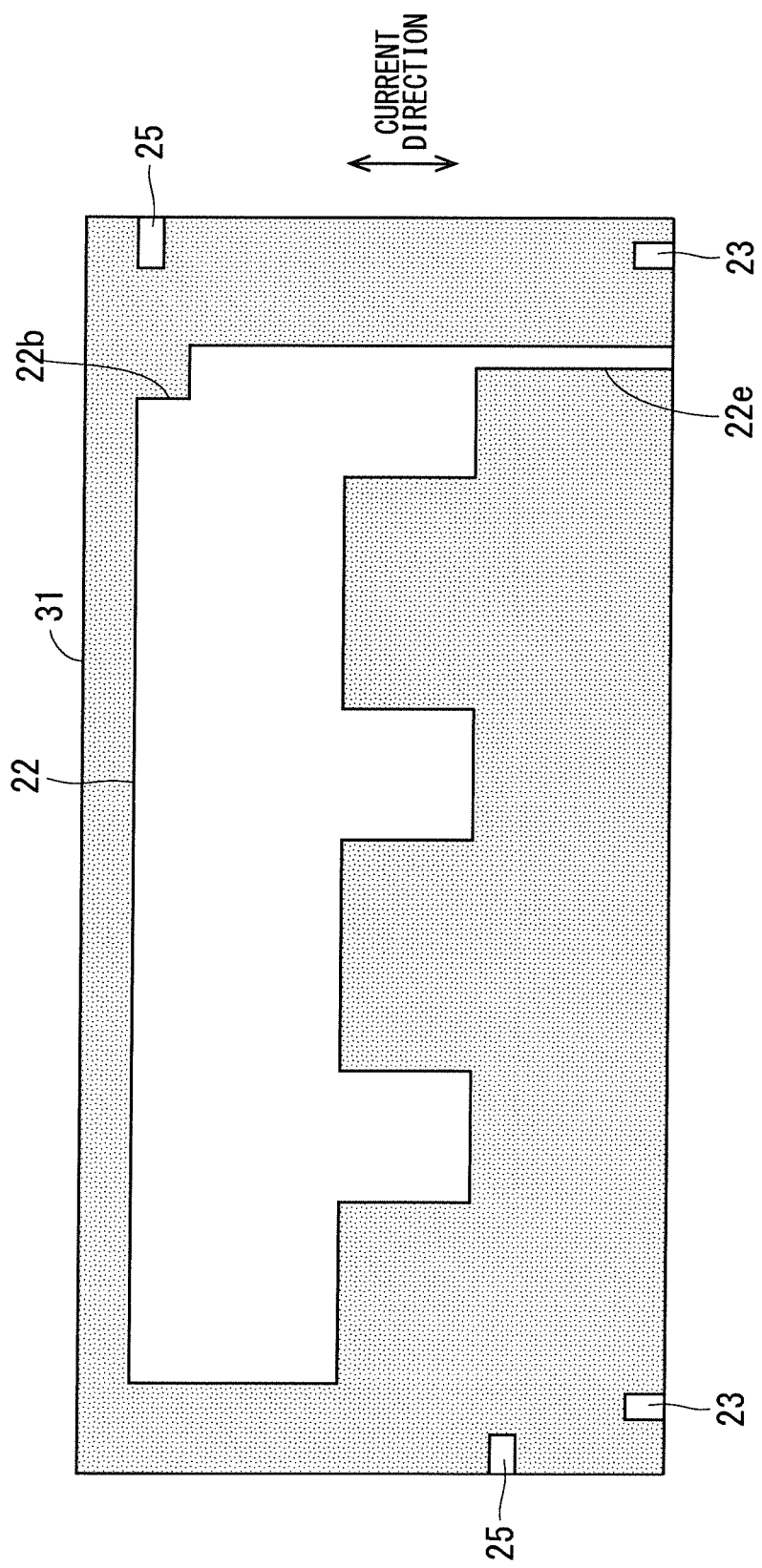
FIG. 24 is a plan view schematically illustrating a configuration of the sub-module according to the second modification of the sixth embodiment.

FIG. 23 is a plan view schematically illustrating a manufacturing step of a sub-module 1 according to a second modification of the sixth embodiment, and FIG. 24 is a plan view schematically illustrating a configuration of the sub-module 1 according to the second modification. The sub-module 1 according to the second modification of the sixth embodiment differs from the sub-module 1 according to the sixth embodiment in that the positions at which the signal and power are extracted are different.

In the second modification, as illustrated in FIG. 24, the exposed portion of the conductive piece 22 in plan view has a convex portion 22e that protrudes in the direction in which current flows across the plurality of sub-modules 1 (see the arrow in FIG. 24). In the second modification, the direction in which the current flows across the plurality of sub-modules 1 is the lateral direction of the sub-modules 1, as in FIG. 7. According to such a configuration, the creeping distance between the exposed portion of the conductive piece 22 and the drain sense terminal 25 increases, so that the screening test can be performed at high voltage and high current. Also, it is typically the case that a circuit pattern is provided in a direction in which current flows across a plurality of sub-modules 1. In such a case, a space for the circuit pattern to be provided is arranged next to the existing circuit pattern without separately securing the space anew for providing the circuit pattern, reducing the semiconductor device in size in plan view.

As with the configuration of FIG. 17, in the configuration of FIG. 24, the exposed portion of the conductive piece 22, the exposed portion of the first control terminal 23, and the exposed portions of the drain sense terminals 25 are exposed from the upper surface of the first sealing member 31 corresponding to the upper surface of the sub-module 1. Therefore, the configuration in which the exposed portion of the conductive piece 22, the exposed portion of the first control terminal 23, and the exposed portion of the drain sense terminal are connected to the wires 75 as illustrated in FIG. 25, and the configuration in which the same components are press-fit connected (not illustrated) are readily formed.

The embodiments and the modifications can be combined, and the embodiments and the modifications can be appropriately modified or omitted.

Hereinafter, various aspects of the present disclosure will be collectively described as Appendices.

Appendix 1

A semiconductor device including
a plurality of sub-modules having a first main surface, a second main surface on an opposite side of the first main surface, and one or more side surfaces between the first main surface and the second main surface,
each of the plurality of sub-modules including
  a plurality of semiconductor elements including a drain electrode provided on the first main surface side, a source electrode and a control electrode provided on the second main surface side,
  a conductive plate provided on the first main surface side of the plurality of semiconductor elements and electrically connected to the drain electrodes of the plurality of semiconductor elements,
  a conductive piece provided on the second main surface side of the plurality of semiconductor elements and electrically connected to the source electrodes of the plurality of semiconductor elements,
  a first control terminal electrically connected to the control electrodes of the plurality of semiconductor elements, and
  a first sealing member that seals the plurality of semiconductor elements, the conductive plate, the conductive piece, and the first control terminal with a portion on the first main surface side of the conductive plate, a portion on the second main surface of the conductive piece, and a portion of the first control terminal exposed,
an insulating substrate provided with a first circuit pattern electrically connected to at least one of the conductive plates of the plurality of sub-modules,
connection members electrically connected to at least one of the conductive pieces of the plurality of sub-modules, and
a second sealing member having lower hardness than the first sealing member, which seals the plurality of sub-modules, the insulating substrate, and the connection members.

Appendix 2

The semiconductor device according to Appendix 1, in which
a side surface of the first sealing member corresponding to the side surface of the sub-module has a protruding portion that protrudes outward in plan view of the first sealing member and partially covers the first control terminal.

Appendix 3

The semiconductor device according to Appendix 2, in which
a step portion is provided on a side portion of the protruding portion.

Appendix 4

The semiconductor device according to any one of Appendices 1 to 3, further including
a case having a lid along the second main surface of the sub-module, and
a control substrate provided on an opposite side of the sub-module with respect to the lid, in which
the first control terminal of the sub-module is electrically connected to the control substrate through a through hole of the lid.

Appendix 5

The semiconductor device according to Appendix 4, in which
the lid has a guide portion that guides the first control terminals to the through hole, and
the case has a mounting portion on which the control substrate is mounted.

Appendix 6

The semiconductor device according to any one of Appendices 1 to 5, in which
a material of the conductive connection members electrically connecting the plurality of semiconductor elements and the conductive plate or the conductive piece contains silver or copper.

Appendix 7

The semiconductor device according to Appendix 1, in which
the portion that is exposed of the first control terminal includes an end portion which is exposed from a side surface of the first sealing member corresponding to the side surface of the sub-module and which is placed on the second main surface of the sub-module, and the semiconductor device further including
a case that encloses the side surfaces of the plurality of sub-modules,
a second control terminal having a first end portion and a second end portion and provided on the case,
a control substrate electrically connected to the first end portion of the second control terminals, and
wires electrically connecting the end portion of the first control terminal and the second end portion of the second control terminal.

Appendix 8

The semiconductor device according to Appendix 1, in which
the insulating substrate is further provided with a second circuit pattern,
the portion that is exposed of the first control terminal is exposed from a side surface of the first sealing member corresponding to the side surface of the sub-module and is electrically connected to the second circuit pattern, and the semiconductor device further including a third control terminal having a first end portion and a second end portion, the first end portion being electrically connected to the second circuit pattern, and a control substrate electrically connected to the second end portion of the third control terminal.

Appendix 9

The semiconductor device according to Appendix 1, in which the portion that is exposed of the first control terminal is exposed from a notch in a boundary portion of the first sealing member corresponding to a boundary portion between the second main surface and the side surface of the sub-module, a surface of the portion that is exposed of the first control terminal on the first main surface side is fixed to the first sealing member, and the semiconductor device further including a fourth control terminal having a first end portion and a second end portion and being away from the sub-module, a control substrate electrically connected to the first end portion of the fourth control terminal, and conductive members electrically connecting the portion that is exposed of the first control terminal and the second end portion of the fourth control terminal.

Appendix 10

The semiconductor device according to Appendix 9, in which the conductive members are wires.

Appendix 11

The semiconductor device according to Appendix 1, in which the one or more side surfaces include a plurality of side surfaces, and the portion that is exposed of the first control terminal exposed from one of the plurality of side surfaces of the first sealing member that respectively correspond to the plurality of side surfaces of the sub-module.

Appendix 12

The semiconductor device according to any one of Appendices 1 to 11, in which the plurality of semiconductor elements are arranged in a plurality of rows, each row extending along the direction in which the conductive plate extends, and the first control terminals include a lead portion provided between the semiconductor elements in the adjacent rows.

Appendix 13

The semiconductor device according to Appendix 12, in which the lead portion is provided in parallel with the conductive plate.

Appendix 14

The semiconductor device according to any one of Appendices 1 to 11, in which the plurality of semiconductor elements are arranged in a row in plan view.

Appendix 15

The semiconductor device according to Appendix 14, in which the semiconductor element has a rectangular shape having long sides in a direction that is different from an arrangement direction in which the plurality of semiconductor elements are arranged in plan view.

Appendix 16

The semiconductor device according to Appendix 15, in which a defect extension direction of the semiconductor element corresponds to a lateral direction of the shape of the semiconductor element in plan view.

Appendix 17

The semiconductor device according to any one of Appendices 1 to 16, in which the plurality of semiconductor elements are provided in a zigzag pattern along the arrangement direction in which the plurality of semiconductor elements are arranged.

Appendix 18

The semiconductor device according to Appendix 17, in which the conductive plate has a concave portion in plan view, and the first control terminal has a convex portion surrounded by the concave portion in plan view.

Appendix 19

The semiconductor device according to any one of Appendices 1 to 18, in which a thickness of the first control terminal is smaller than a thickness of the conductive plate.

Appendix 20

The semiconductor device according to any one of Appendices 1 to 19, further including a drain sense terminal connected to the conductive plate, in which the portion of the conductive piece, the portion of the first control terminal, and a portion of the drain sense terminals are exposed from a surface of the first sealing member corresponding to the second main surface of the sub-module.

Appendix 21

The semiconductor device according to Appendix 20, in which the portion of the conductive piece, the portion of the first control terminal, and a portion of the drain sense terminal are each connected to a wire.

Appendix 22

The semiconductor device according to Appendix 20, in which
the portion of the conductive piece, the portion of the first control terminal, and a portion of the drain sense terminal are each press-fit connected.

Appendix 23

The semiconductor device according to any one of Appendices 1 to 19, further including
a drain sense terminal connected to the conductive plate, in which
the portion of the conductive piece and a portion of the drain sense terminal are exposed from a surface of the first sealing member corresponding to the second main surface of the sub-module,
the portion of the conductive piece has a concave portion in plan view, and
the portion of the drain sense terminal is provided to face the concave portion.

Appendix 24

The semiconductor device according to Appendix 17, further including a drain sense terminal connected to a region adjacent to the two semiconductor elements, which is not a region between the two adjacent semiconductor elements, among regions on the conductive plate.

Appendix 25

The semiconductor device according to any one of Appendices 1 to 24, in which
the portion of the first control terminal is exposed from a surface of the first sealing member corresponding to the second main surface of the sub-module, and
the portion of the first control terminal is provided from one end to another end of the first sealing member in plan view.

Appendix 26

The semiconductor device according to any one of Appendices 1 to 19, further including
a drain sense terminal connected to the conductive plate, and protruding from a side surface of the first sealing member corresponding to the side surface of the sub-module, in which
the first control terminal protrudes from the surface of the first sealing member, and
the conductive piece has a source terminal protruding from the side surface of the first sealing member.

Appendix 27

The semiconductor device according to any one of Appendices 1 to 26, in which
the portion of the conductive piece in plan view has a convex portion that protrudes in the direction in which current flows across the plurality of sub-modules.

Appendix 28

The semiconductor device according to any one of Appendices 1 to 27, in which
a gate resistance element provided in a portion in the first control terminal facing the semiconductor element in plan view, and is connected between control terminal and semiconductor element.

Appendix 29

A method of manufacturing a semiconductor device, including
a preparation step of preparing a plurality of sub-modules having a first main surface, a second main surface on an opposite side of the first main surface, and one or more side surfaces between the first main surface and the second main surface, in which
each of the plurality of sub-modules includes
a plurality of semiconductor elements including a drain electrode provided on the first main surface side, a source electrode and a control electrode provided on the second main surface side,
a conductive plate provided on the first main surface side of the plurality of semiconductor elements and electrically connected to the drain electrodes of the plurality of semiconductor elements,
a conductive piece provided on the second main surface side of the plurality of semiconductor elements and electrically connected to the source electrodes of the plurality of semiconductor elements,
a first control terminal electrically connected to the control electrodes of the plurality of semiconductor elements, and
a first sealing member that seals the plurality of semiconductor elements, the conductive plate, the conductive piece, and the first control terminal with a portion on the first main surface side of the conductive plate, a portion on the second main surface of the conductive piece, and a portion of the first control terminal exposed, the method further comprising:
a screening test step of conducting an electric characteristic inspection in which a voltage is applied to the conductive plate, the conductive piece, and the first control terminal for each of the plurality of sub-modules after the preparation step; and
a step of forming the semiconductor device after the screening test step, in which
the semiconductor device includes
the plurality of sub-modules,
an insulating substrate provided with a first circuit pattern electrically connected to at least one of the conductive plates of the plurality of sub-modules,
connection members electrically connected to at least one of the conductive pieces of the plurality of sub-modules, and
a second sealing member having lower hardness than the first sealing member, which seals the plurality of sub-modules, the insulating substrate, and the connection members.

Appendix 30

The method of manufacturing the semiconductor device according to Appendix 29, in which
the plurality of semiconductor elements and the conductive piece are electrically connected pressurelessly.

Appendix 31

The method of manufacturing the semiconductor device according to Appendix 29 or 30, in which
a melting point of the conductive connection members that electrically connect the plurality of semiconductor elements and the conductive plate or the conductive piece is higher than a processing temperature when assembling the semiconductor device from the plurality of sub-modules.

Appendix 32

The method of manufacturing the semiconductor device according to any one of Appendices 29 to 31, in which
a metal pattern including the first control terminal and the frame and the conductive plate are connected, and,
after forming the first sealing member, the first control terminal is separated from the frame.

Appendix 33

The method of manufacturing the semiconductor device according to Appendix 32, in which
the metal pattern further includes a drain sense terminal to be connected to the conductive plate, and,
after forming the first sealing member, the drain sense terminal is separated from the frame.

Appendix 34

The method of manufacturing the semiconductor device according to Appendix 32 or 33, wherein
a process temperature when assembling the semiconductor device from the plurality of sub-modules is lower than a melting point of a connection portion connecting the metal pattern and the conductive plate.

While the invention has been illustrated and described in detail, the foregoing description is in all aspects illustrative and not restrictive. It is therefore understood that numerous modifications and variations can be devised without departing from the scope of the invention.

What is claimed is:

1. A semiconductor device comprising:
a plurality of sub-modules having a first main surface, a second main surface on an opposite side of the first main surface, and one or more side surfaces between the first main surface and the second main surface,
each of the plurality of sub-modules including
a plurality of semiconductor elements including a drain electrode provided on the first main surface side, a source electrode and a control electrode provided on the second main surface side,
a conductive plate provided on the first main surface side of the plurality of semiconductor elements and electrically connected to the drain electrodes of the plurality of semiconductor elements,
a conductive piece provided on the second main surface side of the plurality of semiconductor elements and electrically connected to the source electrodes of the plurality of semiconductor elements,
a first control terminal electrically connected to the control electrodes of the plurality of semiconductor elements, and
a first sealing member that seals the plurality of semiconductor elements, the conductive plate, the conductive piece, and the first control terminal with a portion on the first main surface side of the conductive plate, a portion on the second main surface of the conductive piece, and a portion of the first control terminal exposed;
an insulating substrate provided with a first circuit pattern electrically connected to at least one of the conductive plates of the plurality of sub-modules;
connection members electrically connected to at least one of the conductive pieces of the plurality of sub-modules; and
a second sealing member having lower hardness than the first sealing member, which seals the plurality of sub-modules, the insulating substrate, and the connection members.

2. The semiconductor device according to claim 1, wherein
a side surface of the first sealing member corresponding to the side surface of the sub-module has a protruding portion that protrudes outward in plan view of the first sealing member and partially covers the first control terminal.

3. The semiconductor device according to claim 1, further comprising:
a case having a lid along the second main surface of the sub-module, and
a control substrate provided on an opposite side of the sub-module with respect to the lid, wherein
the first control terminal of the sub-module is electrically connected to the control substrate through a through hole of the lid.

4. The semiconductor device according to claim 1, wherein
the portion that is exposed of the first control terminal includes an end portion which is exposed from a side surface of the first sealing member corresponding to the side surface of the sub-module and which is placed on the second main surface of the sub-module, and the semiconductor device further comprising;
a case that encloses the side surfaces of the plurality of sub-modules;
a second control terminal having a first end portion and a second end portion and provided on the case;
a control substrate electrically connected to the first end portion of the second control terminals; and
wires electrically connecting the end portion of the first control terminal and the second end portion of the second control terminal.

5. The semiconductor device according to claim 1, wherein
the insulating substrate is further provided with a second circuit pattern,
the portion that is exposed of the first control terminal is exposed from a side surface of the first sealing member corresponding to the side surface of the sub-module and is electrically connected to the second circuit pattern, and the semiconductor device further comprising;

a third control terminal having a first end portion and a second end portion, the first end portion being electrically connected to the second circuit pattern; and a control substrate electrically connected to the second end portion of the third control terminal.

6. The semiconductor device according to claim 1, wherein the portion that is exposed of the first control terminal is exposed from a notch in a boundary portion of the first sealing member corresponding to a boundary portion between the second main surface and the side surface of the sub-module, a surface of the portion that is exposed of the first control terminal on the first main surface side is fixed to the first sealing member, and the semiconductor device further comprising:

a fourth control terminal having a first end portion and a second end portion and being away from the sub-module;

a control substrate electrically connected to the first end portion of the fourth control terminal; and conductive members electrically connecting the portion that is exposed of the first control terminal and the second end portion of the fourth control terminal.

7. The semiconductor device according to claim 1, wherein the plurality of semiconductor elements are arranged in a plurality of rows, each row extending along the direction in which the conductive plate extends, and the first control terminals include a lead portion provided between the semiconductor elements in the adjacent rows.

8. The semiconductor device according to claim 1, wherein the plurality of semiconductor elements are arranged in a row in plan view.

9. The semiconductor device according to claim 8, wherein the semiconductor element has a rectangular shape having long sides in a direction that is different from an arrangement direction in which the plurality of semiconductor elements are arranged in plan view.

10. The semiconductor device according to claim 9, wherein a defect extension direction of the semiconductor element corresponds to a lateral direction of the shape of the semiconductor element in plan view.

11. The semiconductor device according to claim 1, wherein the plurality of semiconductor elements are provided in a zigzag pattern along the arrangement direction in which the plurality of semiconductor elements are arranged.

12. The semiconductor device according to claim 1, wherein a thickness of the first control terminal is smaller than a thickness of the conductive plate.

13. The semiconductor device according to claim 1, further comprising a drain sense terminal connected to the conductive plate, wherein the portion of the conductive piece, the portion of the first control terminal, and a portion of the drain sense terminal are exposed from a surface of the first sealing member corresponding to the second main surface of the sub-module.

14. The semiconductor device according to claim 1, further comprising a drain sense terminal connected to the conductive plate, wherein the portion of the conductive piece and a portion of the drain sense terminal are exposed from a surface of the first sealing member corresponding to the second main surface of the sub-module, the portion of the conductive piece has a concave portion in plan view, and the portion of the drain sense terminal is provided to face the concave portion.

15. The semiconductor device according to claim 1, wherein the portion of the first control terminal is exposed from a surface of the first sealing member corresponding to the second main surface of the sub-module, and the portion of the first control terminal is provided from one end to another end of the first sealing member in plan view.

16. The semiconductor device according to claim 1, further comprising a drain sense terminal connected to the conductive plate, and protruding from a side surface of the first sealing member corresponding to the side surface of the sub-module, wherein the first control terminal protrudes from the side surface of the first sealing member, and the conductive piece has a source terminal protruding from the side surface of the first sealing member.

17. The semiconductor device according to claim 1, wherein the portion of the conductive piece in plan view has a convex portion that protrudes in the direction in which current flows across the plurality of sub-modules.

18. The semiconductor device according to claim 1, further comprising a gate resistance element provided in a portion in the first control terminal facing the semiconductor element in plan view, and is connected between control terminal and semiconductor element.

19. A method of manufacturing a semiconductor device, comprising:

a preparation step of preparing a plurality of sub-modules having a first main surface, a second main surface on an opposite side of the first main surface, and one or more side surfaces between the first main surface and the second main surface, wherein each of the plurality of sub-modules includes a plurality of semiconductor elements including a drain electrode provided on the first main surface side, a source electrode and a control electrode provided on the second main surface side, a conductive plate provided on the first main surface side of the plurality of semiconductor elements and electrically connected to the drain electrodes of the plurality of semiconductor elements, a conductive piece provided on the second main surface side of the plurality of semiconductor elements and electrically connected to the source electrodes of the plurality of semiconductor elements, a first control terminal electrically connected to the control electrodes of the plurality of semiconductor elements, and a first sealing member that seals the plurality of semiconductor elements, the conductive plate, the conductive piece, and the first control terminal with a portion on the first main surface side of the conductive plate, a portion on the second main surface of the conductive piece, and a portion of the first control terminal exposed, the method further comprising:

a screening test step of conducting an electric characteristic inspection in which a voltage is applied to the conductive plate, the conductive piece, and the first control terminal for each of the plurality of sub-modules after the preparation step; and a step of forming the semiconductor device after the screening test step, wherein the semiconductor device includes the plurality of sub-modules, an insulating substrate provided with a first circuit pattern electrically connected to at least one of the conductive plates of the plurality of sub-modules, connection members electrically connected to at least one of the conductive pieces of the plurality of sub-modules, and a second sealing member having lower hardness than the first sealing member, which seals the plurality of sub-modules, the insulating substrate, and the connection members.

20. The method of manufacturing the semiconductor device according to claim 19, wherein a metal pattern including the first control terminal and the frame and the conductive plate are connected, and, after forming the first sealing member, the first control terminal is separated from the frame.

21. The method of manufacturing the semiconductor device according to claim 20, wherein the metal pattern further includes a drain sense terminal to be connected to the conductive plate, and, after forming the first sealing member, the drain sense terminal is separated from the frame.

22. The method of manufacturing the semiconductor device according to claim 20, wherein a process temperature when assembling the semiconductor device from the plurality of sub-modules is lower than a melting point of a connection portion connecting the metal pattern and the conductive plate.

* * * * *